(12) United States Patent
Mizukami et al.

(10) Patent No.: US 8,039,886 B2
(45) Date of Patent: Oct. 18, 2011

(54) DEPLETION-TYPE NAND FLASH MEMORY

(75) Inventors: Makoto Mizukami, Kawasaki (JP); Kiyohito Nishihara, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 154 days.

(21) Appl. No.: 12/603,099

(22) Filed: Oct. 21, 2009

(65) Prior Publication Data

US 2010/0133627 A1    Jun. 3, 2010

(30) Foreign Application Priority Data

Dec. 3, 2008  (JP) ................................ 2008-308607

(51) Int. Cl.
*H01L 29/94* (2006.01)
(52) U.S. Cl. .................... 257/314; 257/322; 257/E29.3; 365/185.25; 365/185.33
(58) Field of Classification Search ................ 257/314, 257/320, 322, 392, E29.3; 365/185.01–185.33
See application file for complete search history.

(56) References Cited

U.S. PATENT DOCUMENTS

| | | | |
|---|---|---|---|
| 6,115,287 A | 9/2000 | Shimizu et al. | |
| 7,432,561 B2 | 10/2008 | Mizukami et al. | |
| 7,432,562 B2 | 10/2008 | Bhattacharyya | |
| 7,459,748 B2 | 12/2008 | Shirota et al. | |
| 7,781,807 B2 * | 8/2010 | Nishihara et al. | 257/250 |
| 2006/0049449 A1 | 3/2006 | Iino et al. | |
| 2007/0002632 A1 | 1/2007 | Okayama et al. | |
| 2008/0128780 A1 | 6/2008 | Nishihara et al. | |
| 2008/0315280 A1 | 12/2008 | Watanabe et al. | |
| 2009/0080250 A1 | 3/2009 | Nishihara et al. | |

FOREIGN PATENT DOCUMENTS

JP          11-163303           6/1999

* cited by examiner

*Primary Examiner* — Jack Chen
(74) *Attorney, Agent, or Firm* — Oblon, Spivak, McClelland, Maier & Neustadt, L.L.P.

(57) ABSTRACT

A depletion-type NAND flash memory includes a NAND string composed of a plurality of serially connected FETs, a control circuit which controls gate potentials of the plurality of FETs in a read operation, a particular potential storage, and an adjacent memory cell threshold storage, wherein each of the plurality of FETs is a transistor whose threshold changes in accordance with a charge quantity in a charge accumulation layer, the adjacent memory cell threshold storage stores a threshold of a source line side FET adjacent to a source line side of a selected FET, and the control circuit applies a potential to the gate electrode of the source line side FET in the read operation, the applied potential being obtained by adding a particular potential stored in the particular potential storage to a threshold stored in the adjacent memory cell threshold storage.

19 Claims, 23 Drawing Sheets

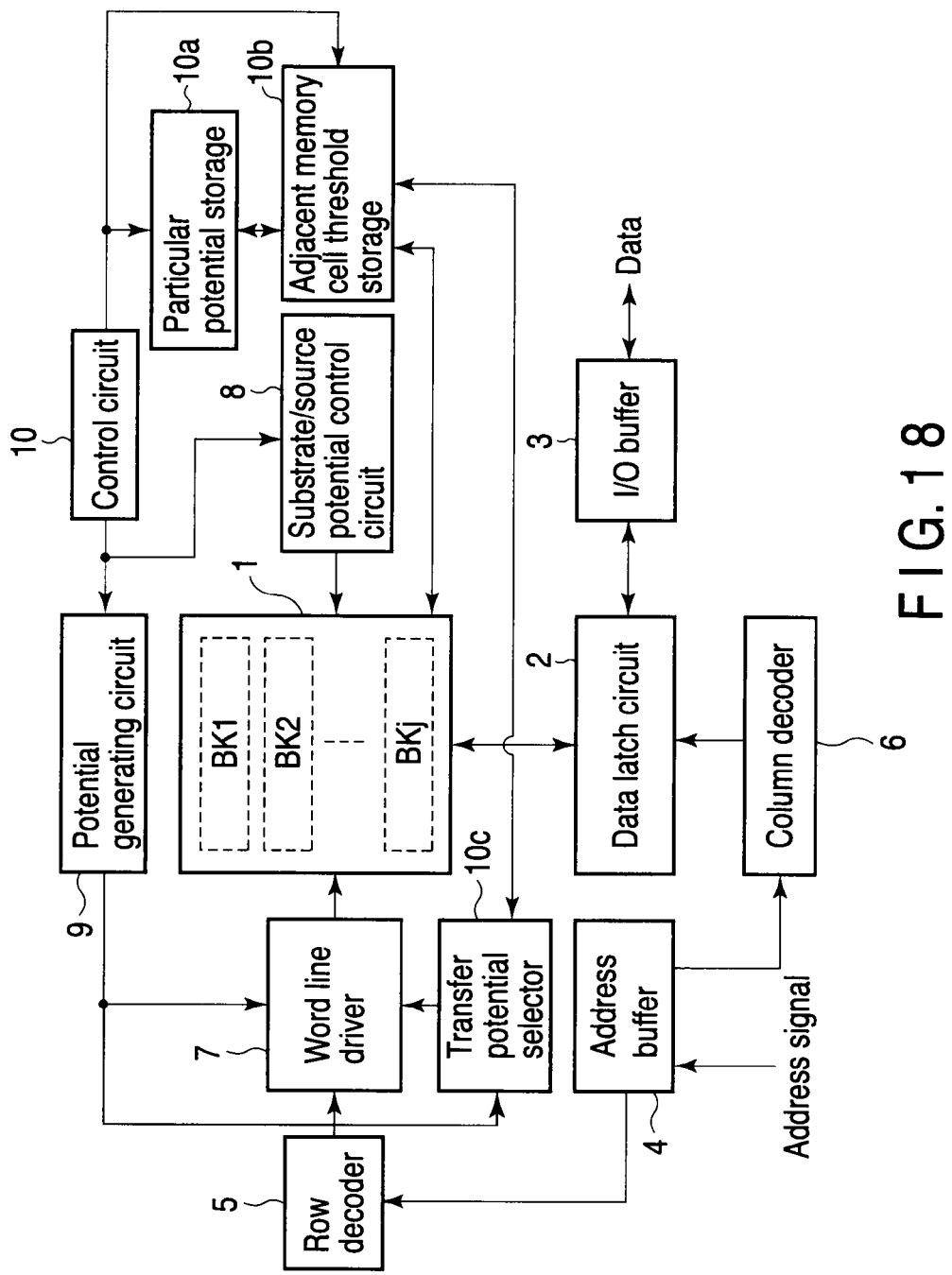
F I G. 18

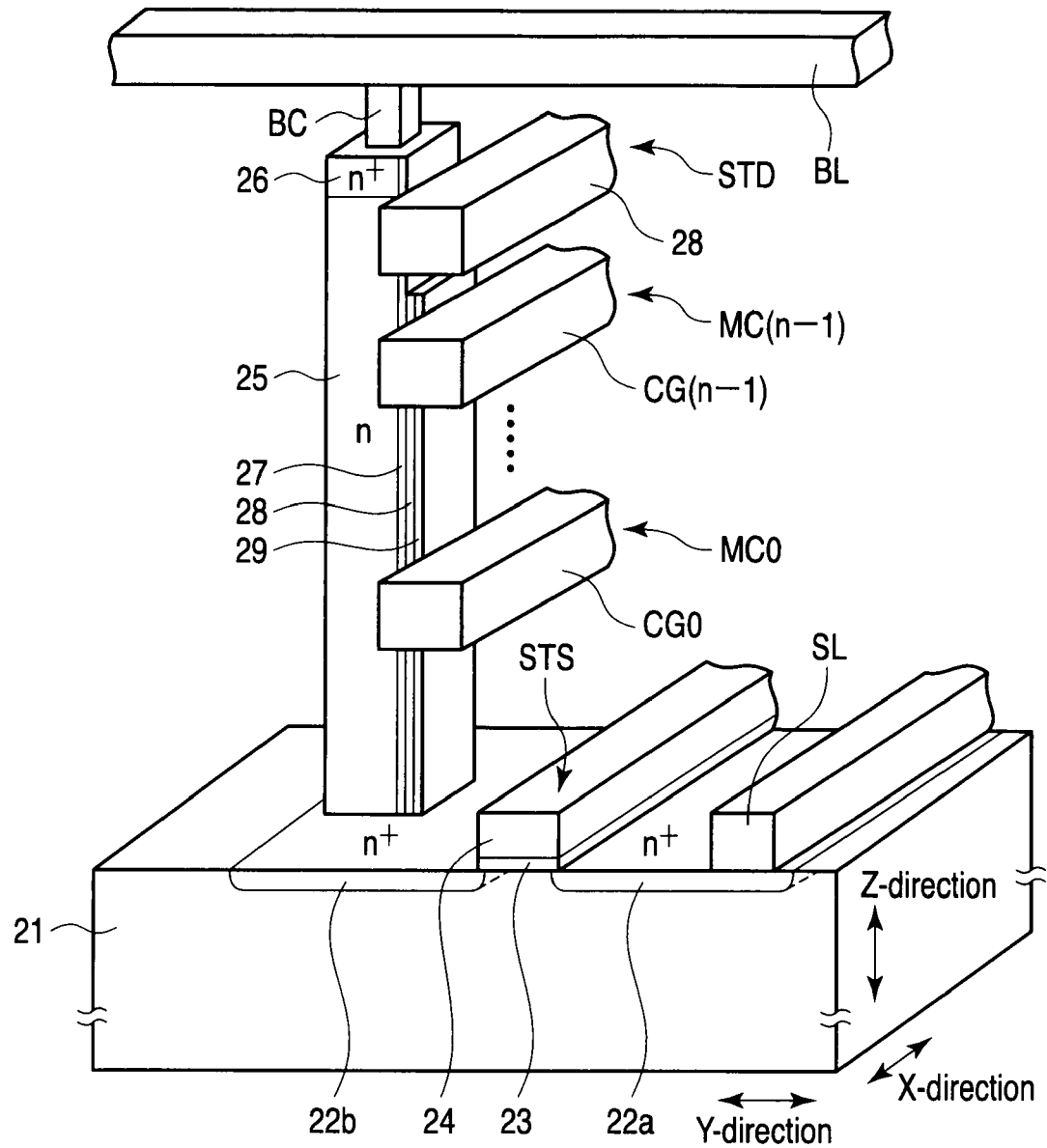
F I G. 23

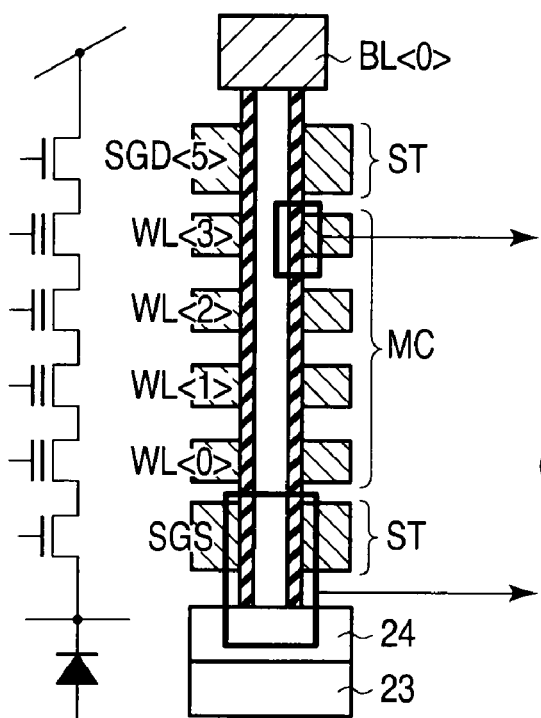
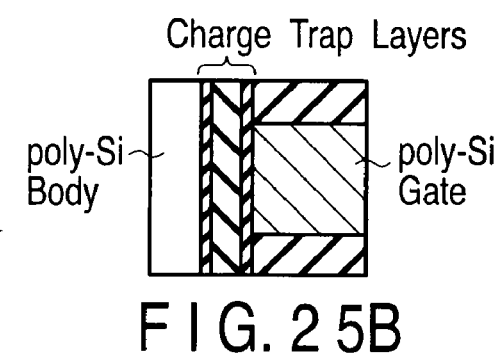
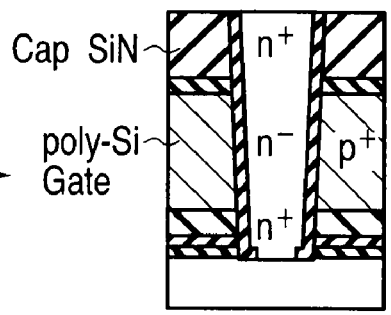
F I G. 25A
F I G. 25B
F I G. 25C

DEPLETION-TYPE NAND FLASH MEMORY

CROSS-REFERENCE TO RELATED APPLICATIONS

This application is based upon and claims the benefit of priority from prior Japanese Patent Application No. 2008-308607, filed Dec. 3, 2008, the entire contents of which are incorporated herein by reference.

BACKGROUND OF THE INVENTION

1. Field of the Invention

The present invention relates to a depletion-type NAND flash memory.

2. Description of the Related Art

A depletion-type NAND flash memory uses, as a memory cell, a depletion-type field effect transistor (FET) in which source/drain diffusion layers and a channel are of the same conductivity type (e.g., n-type). This depletion-type NAND flash memory has been attention recently owing to its suppressed short channel effect caused by shrinking (e.g., see Jpn. Pat. Appln. KOKAI Publication No. 11-163303).

this depletion-type NAND flash memory has been proposed several improvements.

For example, if a silicon-on-insulator (SOI) technique is applied to the depletion-type NAND flash memory, an SOI active layer where memory cells are formed is enclosed by an SOI insulating layer and an isolation insulating layer which are buried insulating layers. As a result, parasitic capacity generated in the memory cells is reduced.

Moreover, if the memory cell of the depletion-type NAND flash memory has a metal/oxide/nitride/oxide/silicon (MONOS) structure, manufacturing costs can be reduced, for example, by the simplification of the cell structure.

However, the depletion-type NAND flash memory has a peculiar problem. That is, turning on/off of the depletion-type FET as a memory cell is controlled by the generation/disappearance of the channel resulting from the expansion/contraction of width of a depletion layer. Then, the expansion/contraction of the width of the depletion layer depends on a charge quantity and a gate potential in a charge accumulation (storage) layer of the memory cell.

Therefore, if the pitch of the cells is reduced, the expansion/contraction of the depletion layer in the focus cell (memory cell) is affected by the charge quantity and the gate potential in the charge accumulation layer of the cell (memory cell) adjacent to the focus cell. This means that the charge quantity and the gate potential in the charge accumulation layer of the adjacent cell change the threshold of the focus cell during reading.

As a result, reading erroneous occurs in the case of reading, and programming erroneous occurs in the case of verify-reading.

BRIEF SUMMARY OF THE INVENTION

According to an aspect of the present invention, there is provided a depletion-type NAND flash memory comprising: a NAND string composed of a plurality of serially connected depletion-type FETs; a control circuit which controls gate potentials of the plurality of depletion-type FETs in a read operation; a particular potential storage; and an adjacent memory cell threshold storage, wherein each of the plurality of depletion-type FETs is a transistor whose threshold changes in accordance with a charge quantity in a charge accumulation layer; the adjacent memory cell threshold storage stores a threshold of a source line side depletion-type FET adjacent to a source line side of a selected depletion-type FET; and the control circuit applies a potential to the gate electrode of the source line side depletion-type FET in the read operation, the applied potential being obtained by adding a particular potential stored in the particular potential storage to a threshold stored in the adjacent memory cell threshold storage.

BRIEF DESCRIPTION OF THE SEVERAL VIEWS OF THE DRAWING

FIG. 18 is a block diagram showing a NAND flash memory as an application;

FIG. 23 is a perspective view showing a first example of a three-dimensional structure;

FIGS. 25A, 25B and 25C are sectional views showing an example of the configuration of a NAND string.

DETAILED DESCRIPTION OF THE INVENTION

Figure 1B:
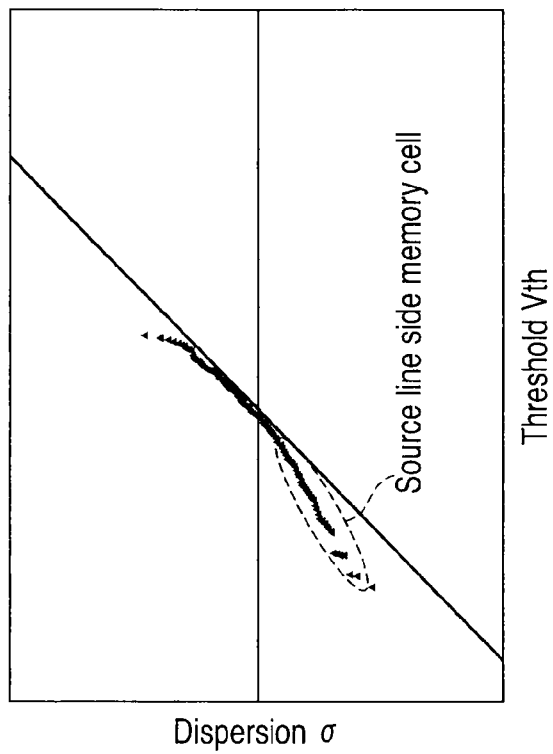
FIGS. 1A and 1B are graphs showing Weibull plots as a referential example.

Preferred embodiments of the present invention will hereinafter be described in detail with reference to the drawings. It should be noted that a threshold means a voltage applied to a gate electrode when a given current (hereinafter referred to as a "threshold voltage") is passed across diffusion layers of a transistor.

1. Outline

In the examples of the present invention, the gate potentials of unselected two adjacent depletion-type FETs on both sides of a selected read target depletion-type FET are controlled in the operation of reading (Verify-reading is included. The same holds true in the following cases as well.) in a depletion-type NAND flash memory.

Specifically, the gate potential Vread(s) of the source line side depletion-type FET adjacent to the source line side of the selected depletion-type FET is set at a value obtained by adding a particular potential +α to the threshold Vth(s) of the source line side depletion-type FET. Likewise, the gate potential Vread(b) of the bit line side depletion-type FET adjacent to the bit line side of the selected depletion-type FET is set at a value obtained by adding the particular potential +α to the threshold Vth(b) of the bit line side depletion-type FET.

That is, in reading, among a plurality of depletion-type FETs constituting a NAND string, all the rest of the unselected depletion-type FETs but the selected depletion-type FET need to be turned on regardless of their thresholds. If the same gate potential Vread for this purpose is used for all the unselected depletion-type FETs, the threshold of the selected depletion-type FET varies depending on the difference between Vread and the threshold Vth(s) of the source line side depletion-type FET and depending on the difference between Vread and the threshold Vth(b) of the bit line side depletion-type FET.

Thus, in the examples of the present invention, the gate potential Vread(s) of the source line side depletion-type FET and the gate potential Vread(b) of the bit line side depletion-type FET are not set at fixed values. Further, the gate potential Vread(s) is set at Vth(s)+α, and the gate potential Vread(b) is set at Vth(b)+α.

In other words, in the examples of the present invention, +α (=Vread(s)−Vth(s)=Vread(b)−Vth(b)) is fixed in the source line side depletion-type FET and the bit line side depletion-type FET to prevent the variation of the threshold of the selected depletion-type FET in reading. In addition, the optimum value of +α changes depending on, for example, the generation of the depletion-type NAND flash memory.

Furthermore, in the depletion-type NAND flash memory, even when the quantity of charge accumulated in each charge accumulation layer on a substrate is the same on condition that the gate dimension and the thickness of gate oxide films are the same, the threshold (associated with the same data) tends to decrease toward the source line in the plurality of depletion-type FETs in the NAND string. The threshold of the memory cell on the source line side also tends to be lower than the threshold of the memory cell on the bit line side after data is simultaneously erased in all the cells or in the case of a neutral threshold at which a charge accumulated by UV irradiation has disappeared.

This is attributed to the fact that the application of a voltage to the bit line and the application of 0 V to the source line cause a potential gradient through the channel which is located between the source line and the bit line. The source potential of a given cell transistor close to the bit line is thus higher than the source potential of a given cell transistor close to the source line. This leads to apparently the same effect as the effect of a back bias (described later), so that a current is easily cut off in the cell transistor close to the bit line. However, in the cell transistor close to the source line, the effect of the back bias is small, and a lower voltage is therefore needed to cut off a current.

Thus, in the examples of the present invention, the particular potential +α is higher when the selected depletion-type FET is positioned closer to the bit line side in the read operation, such that the variation in the threshold of the plurality of depletion-type FETs in the NAND string is corrected.

For the same purpose, in the examples of the present invention, a source potential Vs is lower when the selected depletion-type FET is positioned closer to the drain side (bit line side) in the read operation, such that the variation in the threshold of the plurality of depletion-type FETs in the NAND string is corrected.

Moreover, a back bias Vbias may be applied instead of the source potential Vs. The cell transistor formed on a first semiconductor region. In this case, the back bias Vbias is applied to, for example, a second semiconductor region of a second conductivity type formed under the first semiconductor region, and a depletion layer is generated between the first and second semiconductor regions.

2. Principle

The depletion-type NAND flash memory according to the examples of the present invention has the NAND string constituted of the plurality of serially connected depletion-type FETs. The depletion-type FET is characterized in that the depletion-type FET is on, for example, when the gate potential is zero and when the charge quantity in the charge accumulation layer is minimal, and that its threshold gradually increases along with the increase in the charge quantity in the charge accumulation layer. If data is adapted to this change of the threshold, a binary memory or a multivalued memory can be obtained.

Here, the depletion-type FET is switched on/off by controlling the expansion/contraction of the width of the depletion layer. The depletion-type FET is switched off if a channel disappears due to the expansion of the depletion layer. The depletion-type FET is switched on if a channel is generated due to the contraction of the depletion layer. In addition, the expansion/contraction of the width of the depletion layer depends on the charge quantity and the gate potential in the charge accumulation layer.

When Vread (gate potential) is lower than Vth (threshold), the contraction of the depletion layer in a channel region is insufficient, and the transistor remains off. When Vread is substantially equal to Vth, the depletion layer in the channel region contracts, and the transistor starts to turn on. If Vread is higher than Vth, an accumulation layer is formed in the channel region of the transistor. If a higher Vread is applied, the accumulation layer projects into the cells on both sides of the transistor. As a result, the cutoff capability of both of the cells decreases, and a gate voltage necessary to turn on the transistors on both sides of the transistor of interest reaches a value higher than the original Vth. Consequently, Vth appears to fluctuate, leading to variation and read disturb.

Thus, in reading operation, the expansion/contraction of the width of the depletion layer in the selected read target depletion-type FET depends on its threshold and the gate potential, on the threshold and the gate potential of the source line side depletion-type FET adjacent to the source line side of the selected depletion-type FET, and on the threshold and the gate potential of the bit line side depletion-type FET adjacent to the bit line side of the selected depletion-type FET.

That is, the thresholds and the gate potentials of the source line side depletion-type FET and the bit line side depletion-type FET cause the variation in the threshold of the selected depletion-type FET.

A detailed explanation is given in this regard. In the read operation, among a plurality of depletion-type FETs constituting a NAND string, all the rest of the unselected depletion-type FETs but the selected depletion-type FET need to be turned on regardless of their thresholds. If the same gate potential Vread for this purpose is used for all the unselected depletion-type FETs, the difference between Vread and the threshold Vth(s) of the source line side depletion-type FET and the difference between Vread and the threshold Vth(b) of the bit line side depletion-type FET change with Vth(s) and Vth(b). This change causes the variation in the threshold of the selected depletion-type FET.

As a first measure, the gate potential Vread(s) of the source line side depletion-type FET and the gate potential Vread(b) of the bit line side depletion-type FET are not set at fixed values. Further, the gate potential Vread(s) is set at Vth(s)+$\alpha$, and the gate potential Vread(b) is set at Vth(b)+$\alpha$.

In other words, +$\alpha$ (=Vread(s)−Vth(s)=Vread(b)−Vth(b)) is fixed in the source line side depletion-type FET and the bit line side depletion-type FET to prevent the variation of the threshold of the selected depletion-type FET in reading.

Meanwhile, an SOI technique, for example, is often used in the depletion-type NAND flash memory. That is, an SOI active layer where memory cells are formed is enclosed by an SOI insulating layer and an isolation insulating layer which are buried insulating layers. Thereby, parasitic resistance generated in the memory cells is reduced, and a short channel effect caused by shrinking is suppressed.

In this case, the advantage is that the parasitic resistance is reduced. On the other hand, as shown in FIGS. 1A and 1B, a new problem arises; the threshold of the memory cell on the source line side decreases and the threshold thus varies.

Figure 1A:
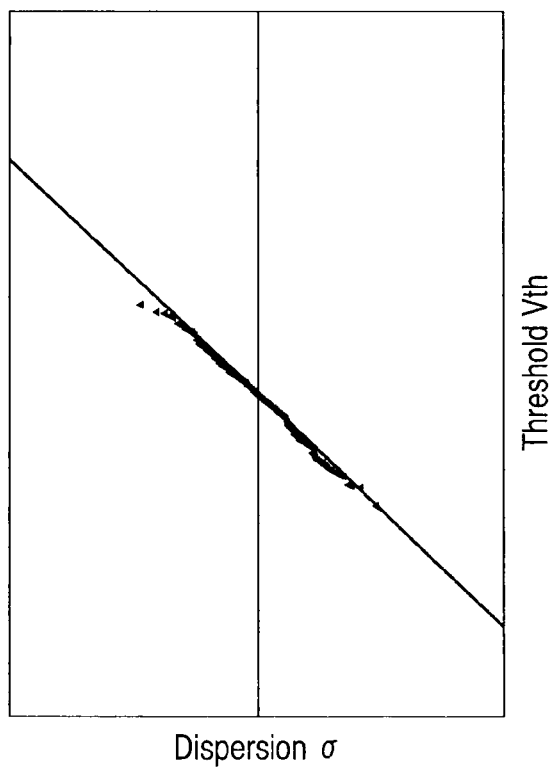

Here, plots in FIGS. 1A and 1B are called Weibull plots, and show the degrees of variation in the case where the same data is written into all the memory cells.

Here, FIGS. 1A and 1B shows Weibull plots of threshold voltages in the case where a current in the vicinity of a linear area in the dynamic characteristics of a memory cell is set as a threshold current.

Each point corresponds to one memory cell. The horizontal axis indicates the threshold, and the vertical axis indicates the dispersion of the thresholds. When a threshold distribution is a normal distribution, the points are on the straight line. A steeper inclination of this straight line means a smaller width of the threshold distribution.

In the case of the Weibull plot shown in FIG. 1A, read operation is performed on following condition: enhancement-type FETs are used as memory cell transistors; the SOI technique is not used; and the gate potentials of all the unselected cells are Vread.

In the case of the Weibull plot shown in FIG. 1B, read operation is performed on the following condition: depletion-type FETs are used as memory cell transistors; the SOI technique (hereinafter referred to as "SOI technique or the like") is used; and the gate potentials of all the unselected cells are Vread.

Vread is 5.5 V. The potential (source potential) Vs of the source line in reading is 0.5 V, and the potential (drain potential) Vd of the bit line is 1.2 V.

It is obvious in FIGS. 1A and 1B that more points are located on the straight line and the threshold distribution is closer to the normal distribution in FIG. 1A than in FIG. 1B.

That is, when the SOI technique or the like is used, the threshold of the memory cell present on the source line side is lower than a desired value, and the variation of the threshold is greater, as shown in FIG. 1B.

Accordingly, in order to eliminate the variation of the threshold, a second measure is used together with the above-described first measure (elimination of the variation of the threshold due to +$\alpha$). The second measure increases +$\alpha$ when the selected read target depletion-type FET is positioned closer to the bit line side.

Alternatively, a third measure is provided in place of the second measure. Thus, the back bias Vbias is changed to control the expansion of the depletion layer at the other end of a first semiconductor region.

The cell transistor formed on a first semiconductor region. In this case, the back bias Vbias is applied to, for example, the second semiconductor region of the second conductivity type formed under the first semiconductor region, and a depletion layer is generated between the first and second semiconductor regions.

Moreover, instead of changing the back bias Vbias, the source potential Vs may be lower when the selected depletion-type FET is positioned closer to the drain side in the read operation.

If +$\alpha$ is decreased or if the source potential Vs (back bias) is decreased, the threshold (associated with the same data) of the selected depletion-type FET increases as will be described in detail in the following embodiments.

Thus, particularly in the depletion-type NAND flash memory to which the SOI technique is applied, the threshold distribution can be closer to an ideal form if the second or third measure is applied to the memory cell (depletion-type FET) on the source line side in which the threshold tends to be low.

In addition, to the second or third measure, it is also possible to apply a technique whereby a semiconductor layer of a conductivity type (p-type) opposite to the conductivity type of the SOI active layer (e.g., an n-type) is placed adjacently to the SOI active layer instead of the SOI insulating layer in order to use a depletion layer generated at a pn junction interface.

3. Embodiments (1) First Embodiment

In the first embodiment, for two adjacent cells on both sides of a read target selected cell, the difference +$\alpha$ between a gate potential and a cell threshold is fixed, thereby preventing the variation of the threshold of the selected cell. The first embodiment corresponds to an embodiment of the first measure in the above-described principle.

Figure 2:
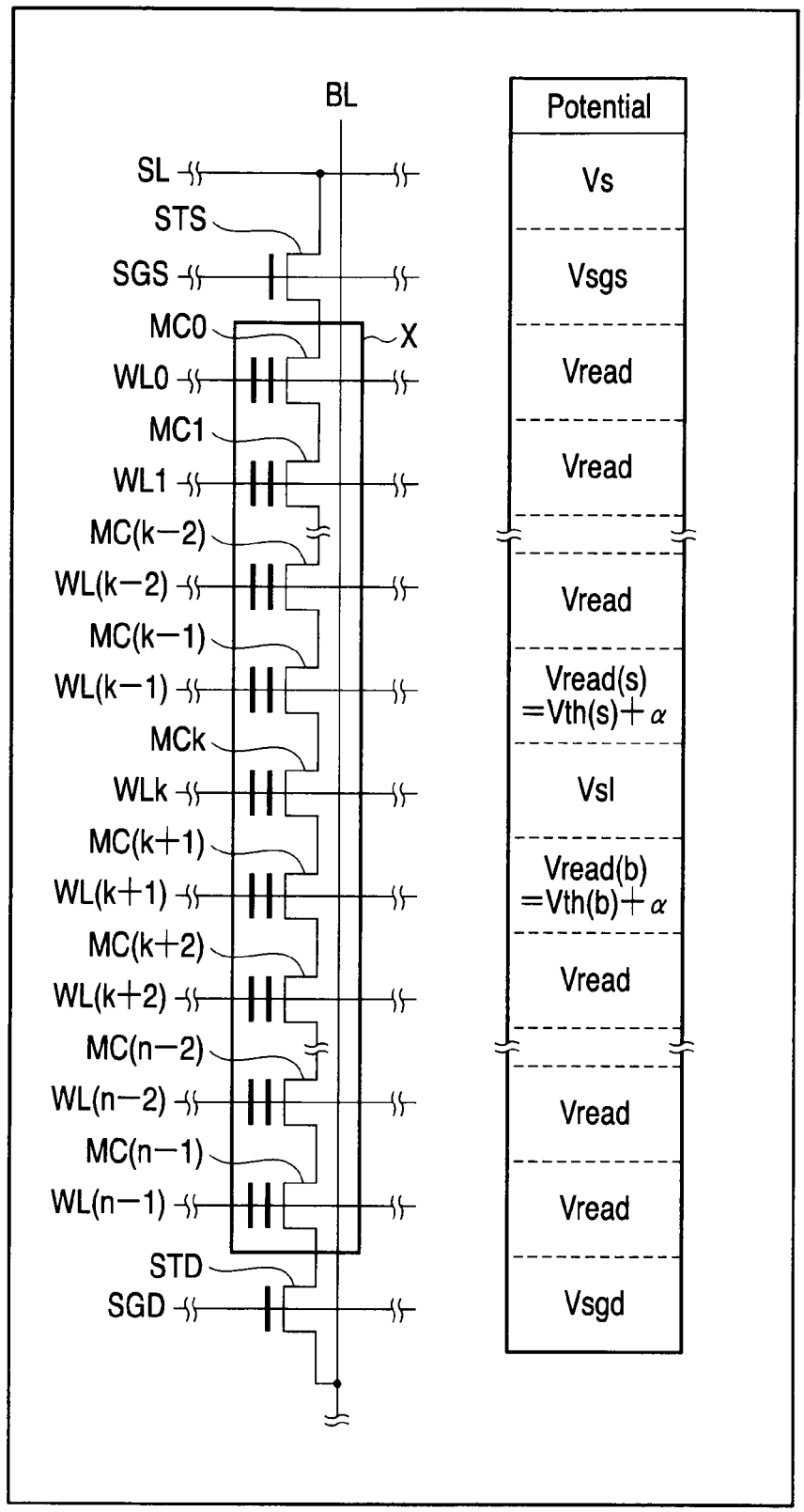
FIG. 2 is a diagram showing a potential relationship in a first embodiment.

FIG. 2 shows a potential relationship in the first embodiment.

It is premised that a NAND string X is constituted of n serially connected memory cells MC0, MC1, MC2, ..., MCk−2, MCk−1, MCk, MCk+1, MCk+2, ..., MCn−2, MCn−1, and that each memory cell is configured by a depletion-type n-channel MOSFET.

Furthermore, a selected cell is the memory cell MCk in the read operation.

In this case, the gate potential of the selected cell MCk, that is, the potential of a word line WLk is set to a potential Vsl at which the memory cell MCk is turned on or off in accordance with a threshold Vth (sel.) of the selected cell. Vsl is set at 0 V, for example, to discriminate between Vth(sel.)=Vth0 (negative potential) and Vth(sel.)=Vth1 (positive potential).

The gate potentials of all the rest of the unselected cells MC0, MC1, MC2, ..., MCk−2, MCk+2, ..., MCn−2, MCn−1, but the selected cell MCk and two cells MCk−1, MCk+1 adjacent to the selected cell, that is, the potentials of word lines WL0, WL1, WL2, ..., WLk−2, WLk+2, ..., WLn−2, WLn−1, are set at a potential Vread at which the cells are always turned on regardless of the threshold Vth(unsel.) of the unselected cells. Vread is set at, for example, 5.5 V.

The gate potential of the cell MCk−1 adjacent to the source line SL side of the selected cell MCk, that is, the potential of the word line WLk−1 is set at Vread(s)=Vth(s)+α obtained by adding a particular potential +α (e.g., 3.5 V) to the threshold Vth(s) of the adjacent cell MCk−1.

The gate potential of the cell MCk+1 adjacent to the bit line BL side of the selected cell MCk, that is, the potential of the word line WLk+1 is set at Vread(b)=Vth(b)+α obtained by adding the particular potential +α (e.g., 3.5 V) to the threshold Vth(b) of the adjacent cell MCk+1.

That is, the difference +α=Vread(s)−Vth(s) between the gate potential of the adjacent cell MCk−1 on the source line SL side and the threshold is equal to the difference +α=Vread(s)−Vth(s) between the gate potential of the adjacent cell MCk+1 on the bit line BL side and the threshold.

At this point, the source line SL is set at Vs (e.g., 0.5 V). The bit line BL is set at Vd (e.g., 1.2 V). Select gate lines SGS, SGD are set at voltages at which select gate transistors STS, STD are turned on. For example, the select gate line SGS is set at Vsgs (4 V), and the select gate line SGD is set at Vsgd (4 V).

In the meantime, in a NAND flash memory, data is read from n memory cells MC0, MC1, MC2, ..., MCk−2, MCk−1, MCk, MCk+1, MCk+2, ..., MCn−2, MCn−1 in the NAND string X, one by one from the memory cell on the source line SL side to the memory cell on the bit line BL side.

The memory cell MC0 closest to the source line SL side only has the adjacent cell MC1 on the bit line BL side. Thus, when all the memory cells in the NAND string are used for saving data, the gate potential of this adjacent cell MC1 is set at Vread(b)=Vth(b)+α.

Moreover, the memory cell MCn−1 closest to the bit line BL side only has the adjacent cell MCn−2 on the source line SL side. Thus, the gate potential of this adjacent cell MCn−2 is set at Vread(s)=Vth(s)+α.

On the other hand, among n memory cells in the NAND string, the memory cell MC0 closest to the source line SL side and the memory cell MCn−1 closest to the bit line BL side may be dummy cells which are not used for saving data.

In this case, the memory cells are absolutely present on both sides in the case of n−2 memory cells MC1, MC2, ..., MCk−2, MCk−1, MCk, MCk+1, MCk+2, ..., MCn−2 in the NAND string X which are used for saving data. As a result, it is possible to effectively prevent the variation of the thresholds of all the memory cells which are used for saving data.

Furthermore, if the thresholds of the dummy cells are fixed at the thresholds in an erased state, reading of the threshold of the adjacent cell (MC1, MCn−1) can be omitted when the cell MC1 or the cell MCn−2 is selected.

The following modification can be made.

In the first embodiment, before data in the selected cell MCk is read, the thresholds of two adjacent cells MCk−1, MCk+1 on both sides of the selected cell MCk have to be recognized in advance.

Figure 3:
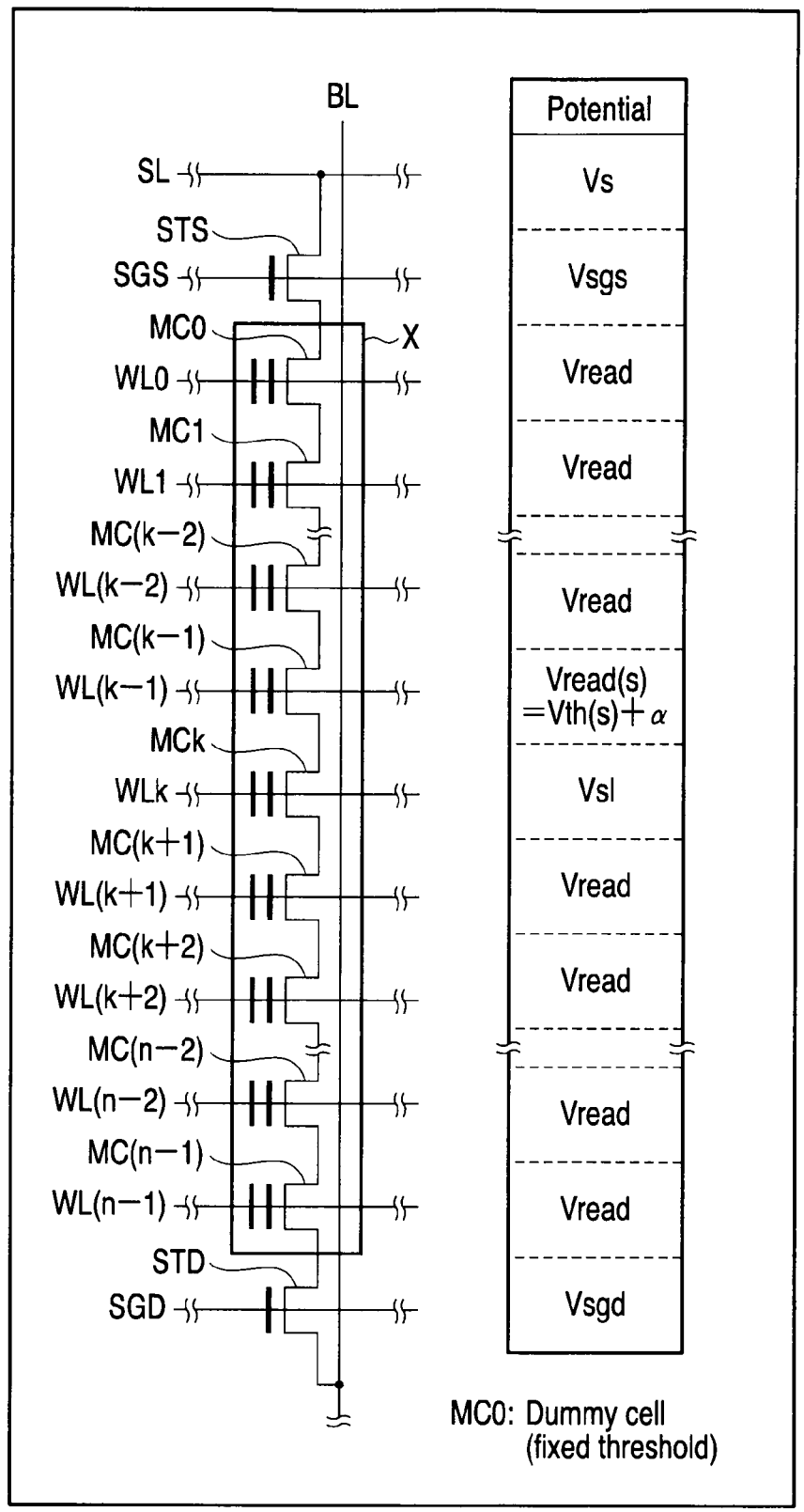
FIG. 3 is a diagram showing a modification of the potential relationship.

On the other hand, as shown in FIG. 3, among n memory cells in the NAND string, the gate potential of the cell MCk−1 adjacent to the source line SL side of the selected cell MCk can be set at Vread(s)=Vth(s)+α, and the gate potentials of all the other unselected cells MC0, MC1, MC2, ..., MCk−2, MCk+1, MCk+2, ..., MCn−2, MCn−1 can be the same Vread.

That is, this is the case where Vread of the cell MCk+1 adjacent to the bit line BL side is not corrected. In this case, there is no need to recognize the threshold of the cell MCk+1 in advance. Therefore, the variation of the threshold of the selected cell can be advantageously prevented, and at the same time, data in the selected cell MCk can be read at high speed.

Furthermore, in the case of a method in which data is sequentially programming from the memory cell transistor on the source side, the cell adjacent to the bit line BL side of the selected cell MCk is in an erased state. Particularly in verify-reading of the selected cell MCk, the cell adjacent to the bit line BL side is often in an erased state. That is, if the threshold in the erased state is stored, there is no need to read the threshold of the cell adjacent to the bit line BL side, and the threshold of the cell adjacent to the bit line BL side can be the same Vread(d)=Vth(e){Vth in erased state}+α. Consequently, the variation of the threshold of the selected cell can be prevented, and at the same time, data can be read at high speed.

This modification also advantageously prevents the variation of the threshold of the selected cell.

Figure 4B:
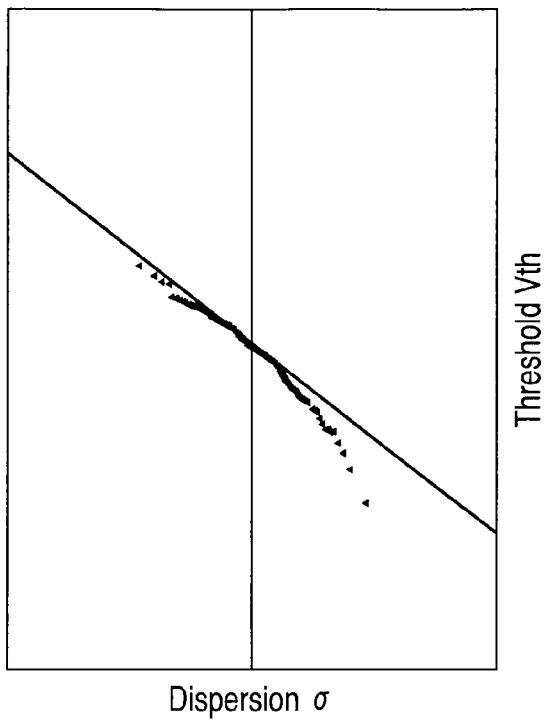
FIGS. 4A and 4B are graphs showing effects of the improvement in threshold variation according to the first embodiment.
Figure 4A:
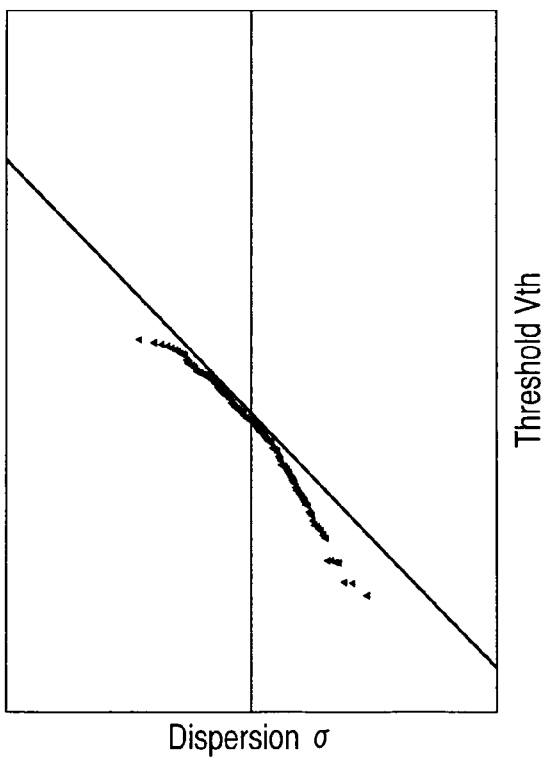

FIGS. 4A and 4B shows effects of the improvement in the threshold variation according to the first embodiment.

FIGS. 4A and 4B shows Weibull plots of threshold voltages in the case where a current in the vicinity of a linear area in the dynamic characteristics of a memory cell is set as a threshold current.

Here, the definition of the points is the same as in that FIG. 1 and is not described.

In the case of the Weibull plot shown in FIG. 4A, read operation is performed on condition that the gate potentials of all the unselected cells are Vread. FIG. 4A corresponds to FIG. 1B.

In the case of the Weibull plot shown in FIG. 4B, read operation is performed on the following condition: the gate potential of the cell adjacent to the source side is Vread(s)=Vth(s)+α; the gate potential of the cell adjacent to the bit side is Vread(b)=Vth(b)+α; and the gate potentials of all the other unselected cells are Vread.

Vread is 5.5 V and +α is 3.5 V.

Moreover, the potential (source potential) Vs of the source line in reading is 0.5 V, and the potential (drain potential) Vd of the bit line is 1.2 V.

It is obvious in FIGS. 4A and 4B that more points are located on the straight line and the threshold distribution is closer to the normal distribution in FIG. 4B than in FIG. 4A. It is also obvious that the inclination of the straight line is steeper and the variation of the threshold is smaller in FIG. 4B than in FIG. 4A.

Figure 5:
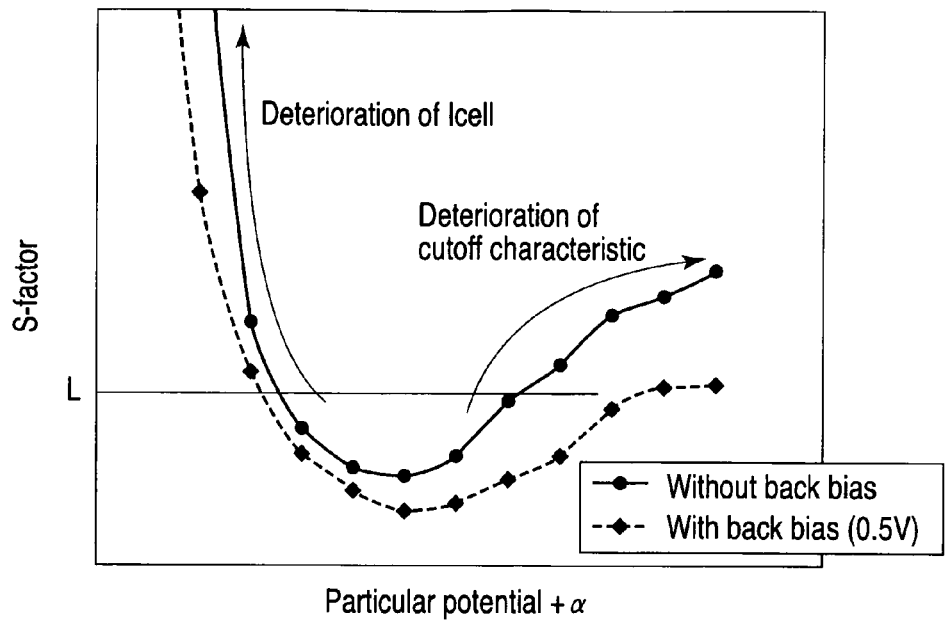
FIG. 5 is a graph showing how to decide an optimum of a particular potential.

FIG. 5 shows how to decide an optimum particular potential.

The particular potential +α is decided on the basis of an S-factor. The S-factor is a sub-threshold factor, and here means a variation of the gate potential of the selected cell necessary for a single-digit change of a drain current.

If the particular potential +α is lower, the channel resistance of the cells adjacent to the selected cell is higher. As a result, a variation of the drain current is smaller than a change of the gate potential of the selected cell, that is, than a variation of the channel resistance of the selected cell (deterioration of a cell current Icell), so that the S-factor is higher.

On the contrary, if the particular potential +α is higher, there is a greater effect of the gate potential of the adjacent cell that degenerates of a width of a depletion layer of the selected cell, and cutoff of a current is more difficult. As a result, a variation of the channel resistance of the selected cell, that is, a variation of the drain current is smaller than the change of the gate potential of the selected cell (deterioration of cutoff characteristic), so that the S-factor is higher.

Although the S-factor should be lower, the Icell is lower (deterioration of the Icell) if the particular potential +α is lower. Therefore, it is necessary to decide an upper limit (L in FIG. 5) of the S-factor. The optimum range of the particular potential +α is decided below the upper limit of the S-factor.

For example, when the upper limit is represented by L, the optimum particular potential +α without any back bias ranges from 1.75 to 4 V.

In the case with a back bias, a negative voltage is applied to a semiconductor layer when data is read from memory cells in an active layer of an SOI substrate which is composed of a semiconductor layer, an insulating layer and an n-type active layer. The cutoff characteristic of the memory cell is improved if the back bias is applied to the semiconductor layer. Thus, the S-factor is low as a whole. Moreover, setting a substrate potential at negative γ V, a source potential at 0 V and a drain potential at Vd is equivalent to setting a substrate potential at 0 V, a source potential at +γ V and a drain potential at Vd+γ V. In this case, there is no need for a drive for applying a negative bias, thereby enabling the size reduction of a semiconductor device.

However, the relationship between the particular potential +α and the S-factor changes depending on, for example, the interval between the depletion-type NAND flash memories. It is therefore impossible to decide a unique optimum particular potential +α.

(2) Second Embodiment

In the second embodiment, for two adjacent cells on both sides of a read target selected cell, the difference +α between a gate potential and a cell threshold is fixed, and +α is changed depending on the position of the selected cell, thereby preventing the variation of the threshold of the selected cell. The second embodiment corresponds to an embodiment of the second measure in the above-described principle.

The second embodiment is an improvement of the first embodiment and therefore includes all the characteristics of the first embodiment. Changing +α depending on the position of the selected cell is an additional characteristic of the second embodiment that is not in the first embodiment.

Figure 6:
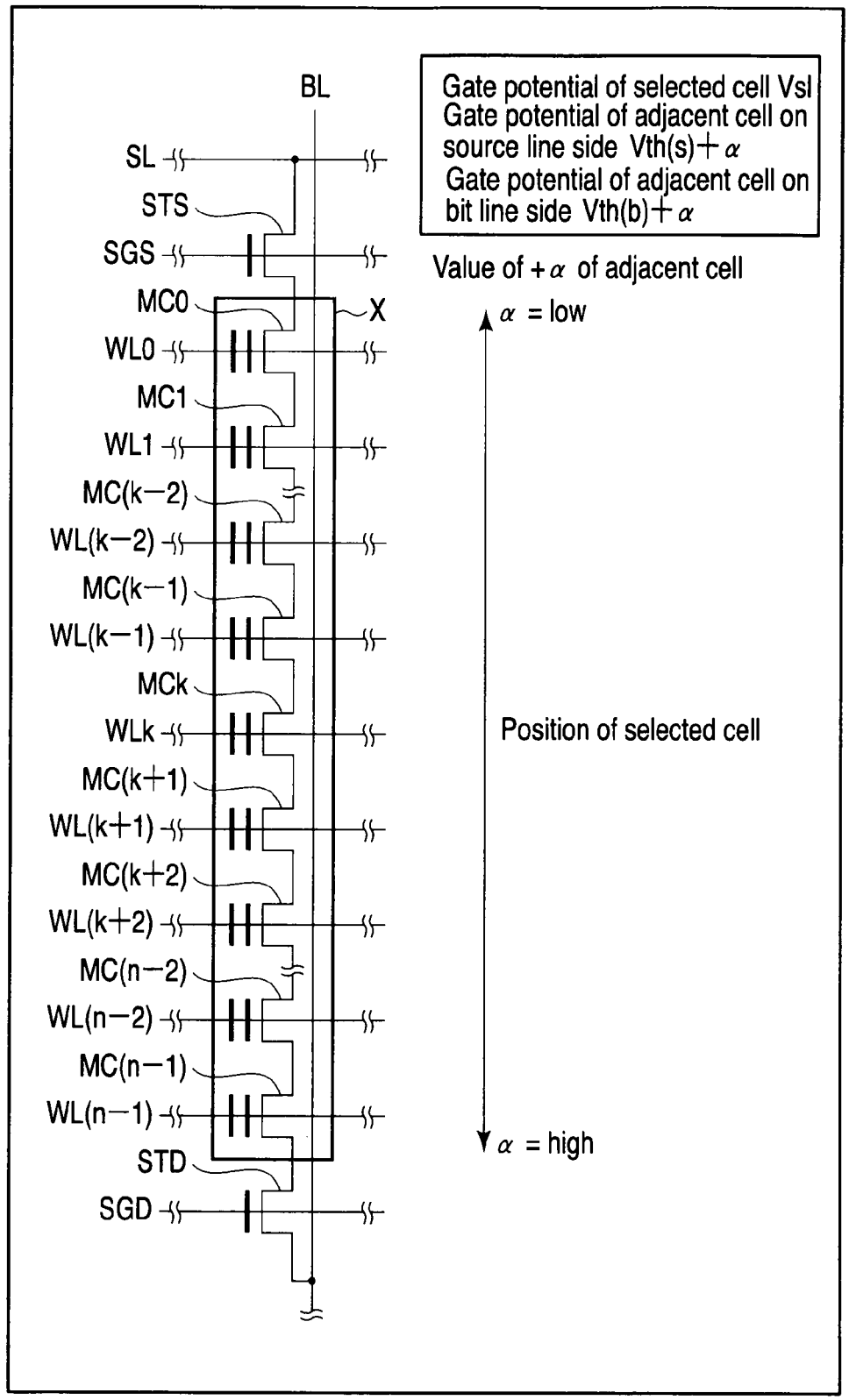
FIG. 6 is a diagram showing a potential relationship in a second embodiment.

FIG. 6 shows a potential relationship in the second embodiment.

It is premised that a NAND string X is constituted of n serially connected memory cells MC0, MC1, MC2, ..., MCk−2, MCk−1, MCk, MCk+1, MCk+2, ..., MCn−2, MCn−1, and that each memory cell is configured by a depletion-type n-channel MOSFET.

The gate potential of the selected cell is set to a potential Vsl at which the memory cell MCk is turned on or off in accordance with a threshold Vth (sel.) of the selected cell.

The gate potentials of all the rest of the unselected cells but the selected cell and two cells adjacent to the selected cell are set at a potential Vread at which the cells are always turned on regardless of the threshold Vth(unsel.) of the unselected cells.

The gate potential of the cell adjacent to the source line SL side of the selected cell is set at Vread(s)=Vth(s)+α obtained by adding a particular potential +α to the threshold Vth(s) of the adjacent cell. The gate potential of the cell adjacent to the bit line BL side of the selected cell is set at Vread(b)=Vth (b)+α obtained by adding the particular potential +α to the threshold Vth(b) of the adjacent cell.

That is, the difference +α=Vread(s)−Vth(s) between the gate potential of the adjacent cell on the source line SL side and the threshold is equal to the difference +α=Vread(s)−Vth(s) between the gate potential of the adjacent cell on the bit line BL side and the threshold.

At this point, the source line SL is set at Vs (e.g., 0.5 V). The bit line BL is set at Vd (e.g., 1.2 V). Select gate lines SGS, SGD are set at voltages at which select gate transistors STS, STD are turned on. For example, the select gate line SGS is set at Vsgs (4 V), and the select gate line SGD is set at Vsgd (4 V).

In the meantime, as shown in FIG. 1(b), the threshold (associated with the same data) tends to decrease toward the source line in a plurality of memory cells (a plurality of depletion-type FETs) in the NAND string X. This tendency is obvious particularly after collective data erasing or after disappearance of a charge due to UV irradiation in the NAND string X. That is, this tendency results from a greater variation of the threshold in an erased state in the case of the collective erasure of data erasing.

In the second embodiment, in order to eliminate the variation of the threshold, +α of the adjacent cell is lower when the selected cell is closer to the source line SL in the read operation, while +α of the adjacent cell is higher when the position of the selected cell is closer to the bit line BL.

It is possible, for example, to change +α in the following ways: (A) +α is successively changed every change of the position of the selected cell (successive change); (B) +α is changed step by step in response to two or more changes of the position of the selected cell (step-by-step change); (C) +α is changed by the combination of A and B.

Furthermore, A, B or C can be applied only to m(<n) memory cells on the source line SL side among n memory cells in the NAND string. In this case, with regard to n-m memory cells on the bit line side is fixed +α of the adjacent cell regardless of the position of the selected cell.

Figure 7:
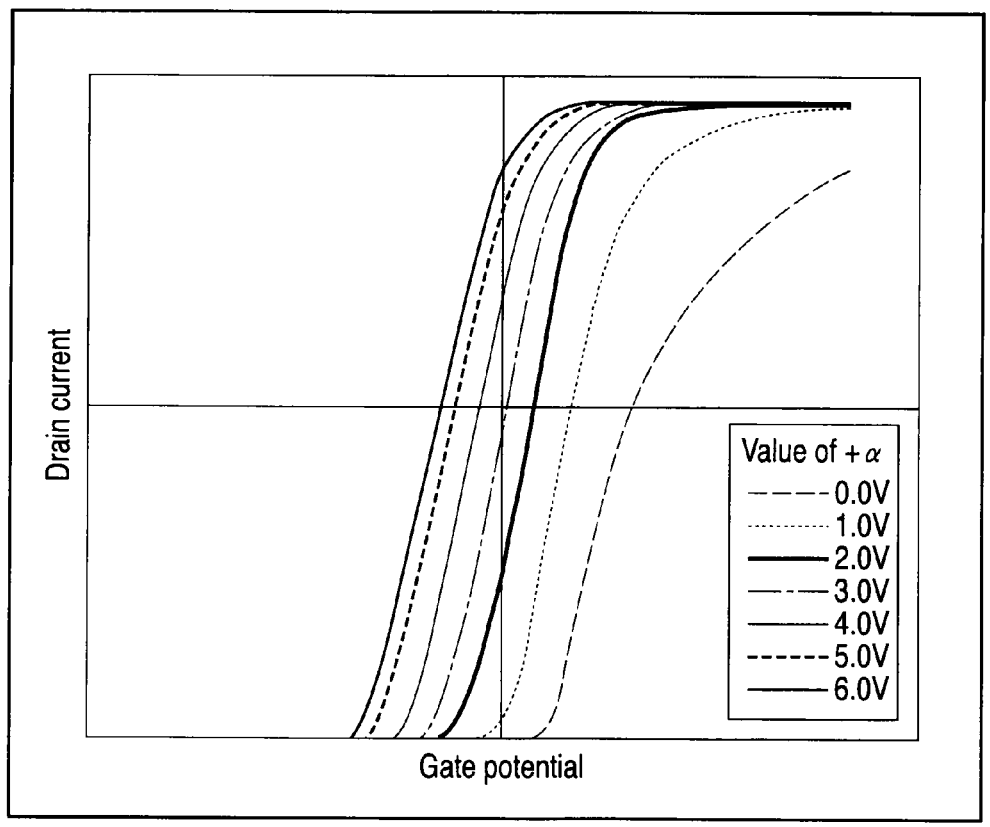
FIG. 7 is a graph showing threshold variation dependent on +α.

As shown in FIG. 7, the change of +α is based on the fact that the threshold of the selected cell depends on +α of the adjacent cell. That is, in the case where +α of two adjacent cells is the same, the threshold of the selected cell is lower if +α is higher, while the threshold of the selected cell is higher if +α is lower.

Thus, when a memory cell on the source line side in which at least the threshold tends to be low is the selected cell, +α of the two adjacent cells is decreased to correct the threshold of the selected cell to a higher value. Thereby, the variation of the threshold of the plurality of memory cells in the NAND string is eliminated.

Table 1 shows an example of +α.

TABLE 1

| Selected word line | Vd | Vs | Vread(s)/Vread(b) |
|---|---|---|---|
| WL01~WL03 | 1.2 V | 0.5 V | Vth(s) + 2.5 V/Vth(b) + 2.5 V |
| WL04~WL06 | | | Vth(s) + 3.0 V/Vth(b) + 3.0 V |
| WL07~WL62 | | | Vth(s) + 3.5 V/Vth(b) + 3.5 V |

In this example, the number of word lines in one block, that is, the number of word lines in one NAND string is 64. These word lines are represented by WL00 to WL63. WL00 is the word line closest to the source line, and WL63 is the word line closest to the bit line.

Furthermore, the memory cells connected to WL00 and WL63 are dummy cells, and their threshold is fixed at, for example, a negative potential as an erased state (or an initial state).

In this case, the word line connected to the selected cell is one of WL01 to WL62. The word line connected to the selected cell is the selected word line.

Moreover, the potential (source potential) Vs of the source line SL is, for example, 0.5 V, and the potential (drain potential) Vd of the bit line is, for example, 1.2 V.

When one of WL01 to WL03 is selected, +α is, for example, 2.5 V. That is, Vread(s) of the cell adjacent to the source line SL side of the selected cell is set at Vth(s)+α (=2.5 V), and Vread(b) of the cell adjacent to the bit line BL side of the selected cell is set at Vth(b)+α (=2.5 V).

When one of WL04 to WL06 is selected, +α is, for example, 3.0 V. That is, Vread(s) of the cell adjacent to the source line SL side of the selected cell is set at Vth(s)+α (=3.0 V), and Vread(b) of the cell adjacent to the bit line BL side of the selected cell is set at Vth(b)+α (=3.0 V).

When one of WL07 to WL62 is selected, +α is, for example, 3.5 V. That is, Vread(s) of the cell adjacent to the source line SL side of the selected cell is set at Vth(s)+α (=3.5 V), and Vread(b) of the cell adjacent to the bit line BL side of the selected cell is set at Vth(b)+α (=3.5 V).

Figure 8B:
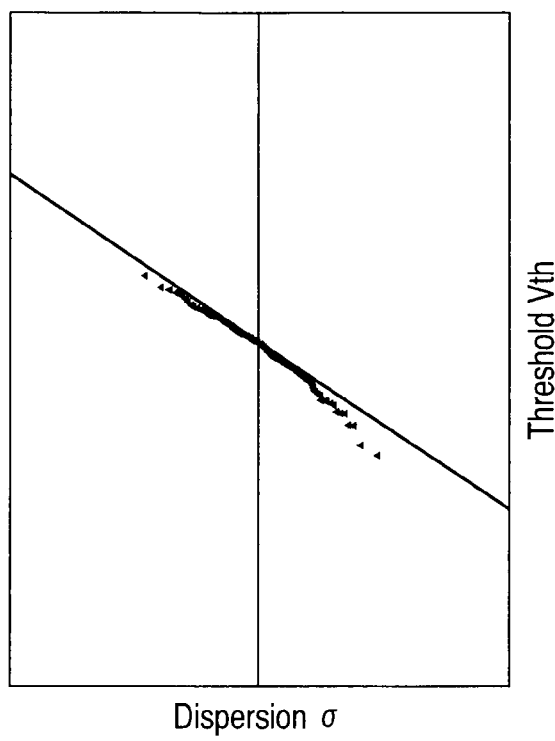
FIGS. 8A and 8B are graphs showing effects of the improvement in the threshold variation according to the second embodiment.
Figure 8A:
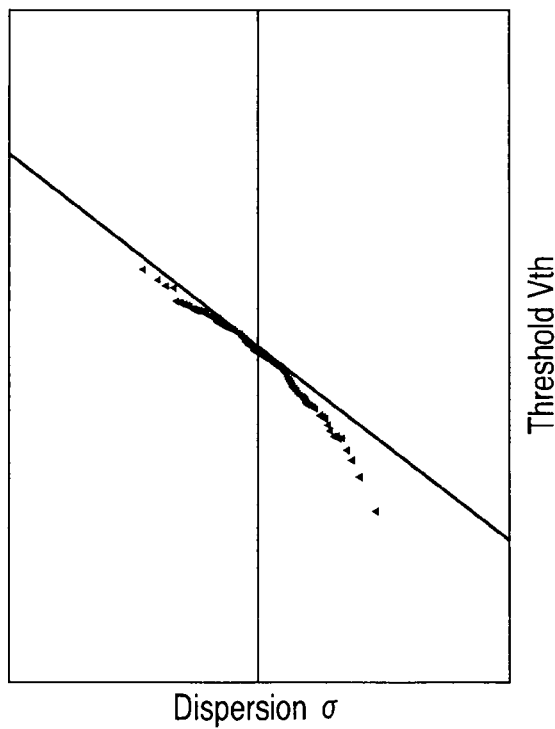

FIGS. 8A and 8B shows effects of the improvement in the threshold variation according to the second embodiment.

FIGS. 8A and 8B shows Weibull plots of threshold voltages in the case where a current in the vicinity of a linear area in the dynamic characteristics of a memory cell is set as a threshold current.

Here, the definition of the points is the same as in that FIG. 1 and is not described.

In the case of the Weibull plot shown in FIG. 8A, read operation is performed on the following condition: the gate potential of the cell adjacent to the source side is Vread(s)=Vth(s)+α; the gate potential of the cell adjacent to the bit side is Vread(b)=Vth(b)+α; and the gate potentials of the other unselected cells are Vread. Regardless of the position of the word line, +α is fixed. FIG. 8A corresponds to FIG. 4B.

In the case of the Weibull plot shown in FIG. 8B, read operation is performed on the following condition: the gate potential of the cell adjacent to the source side is Vread(s)=Vth(s)+α; the gate potential of the cell adjacent to the bit side is Vread(b)=Vth(b)+α; the gate potentials of the other unselected cells are Vread; and +α is changed depending on the position of the selected cell.

Vread is 5.5 V.

In FIG. 8A, +α is 3.5 V. In FIG. 8B, there are three magnitudes of +α: 2.5, 3.0 and 3.5 V, and +α is decided in accordance with Table 1.

Moreover, the potential (source potential) Vs of the source line in reading is 0.5 V, and the potential (drain potential) Vd of the bit line is 1.2 V.

It is obvious in FIGS. 8A and 8B that more points are located on the straight line and the threshold distribution is closer to the normal distribution in FIG. 8B than in FIG. 8A. It is also obvious that the inclination of the straight line is steeper and the variation of the threshold is smaller in FIG. 8B than in FIG. 8A.

Figure 9B:
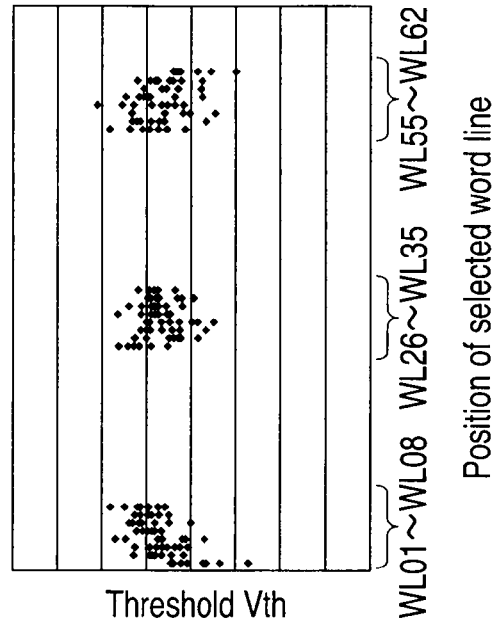
FIGS. 9A and 9B are graphs showing effects of the improvement in the threshold variation according to the second embodiment.
Figure 9A:
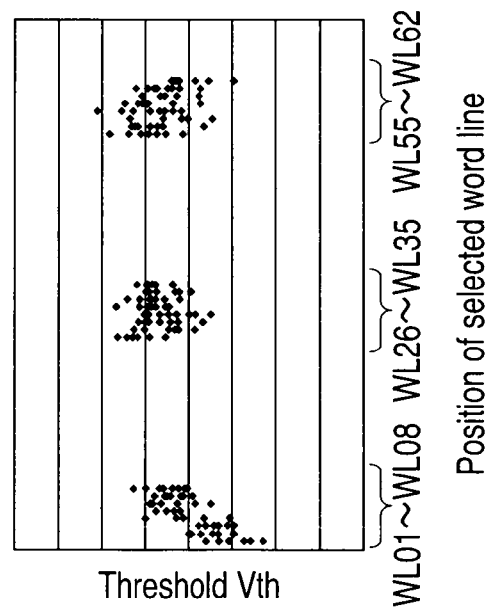

FIGS. 9A and 9B shows the relationship between the position of the selected word line and the threshold. In addition, the word lines WL (e.g., WL09, etc.) that are not shown on the X-axis in FIGS. 9A and 9B are omitted for convenience.

Samples in FIGS. 9A and 9B are the same as the samples in the Weibull plots shown in FIGS. 8A and 8B. That is, FIGS. 9A and 9B shows how the threshold of each point (corresponding to one memory cell) in FIGS. 8A and 8B changes with the position of the selected word line (the position of the selected cell).

FIG. 9A corresponds to FIG. 8A, and FIG. 9B corresponds to FIG. 8B.

The problem of the low threshold of the memory cell on the source line side is not fully solved in FIG. 9A, that is, in the case where the first embodiment is only applied. In contrast, it is obvious in FIG. 9B, that is, in the second embodiment that the phenomenon of the extremely low threshold of the memory cell on the source line side is prevented and the variation of the threshold distribution is suppressed.

This holds true particularly with the case where data is programmed into the selected memory cell after collective erasure of data erasing or after disappearance of a charge due to UV irradiation. This results from a greater variation of the threshold in an erased state in the case of the collective erasure of data erasing.

(3) Third Embodiment

In the third embodiment, for two adjacent cells on both sides of a read target selected cell, the difference +α between a gate potential and a cell threshold is fixed, and a back bias Vbias is changed depending on the position of the selected cell, thereby preventing the variation of the threshold of the selected cell. The third embodiment corresponds to an embodiment of the third measure in the above-described principle.

The third embodiment is an improvement of the first embodiment and therefore includes all the characteristics of the first embodiment. Changing the back bias Vbias depending on the position of the selected cell is an additional characteristic of the third embodiment that is not in the first embodiment.

The back bias Vbias is first described.

Figure 10:
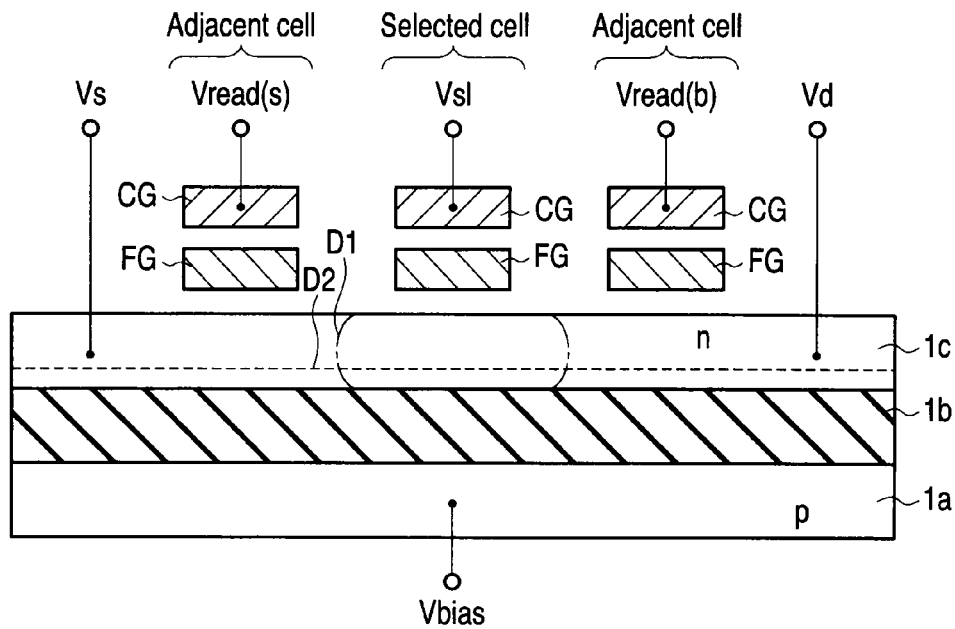
FIG. 10 is a diagram showing a back bias.

FIG. 10 shows a schematic view of a NAND string of a depletion-type NAND flash memory to which the SOI technique is applied.

An SOI substrate is composed of a p-type semiconductor region (e.g., a p-type semiconductor substrate) 1a, a buried insulating layer (SOI insulating layer) 1b on the p-type semiconductor region 1a, and an n-type semiconductor region (SOI active layer) 1c on the buried insulating layer 1b.

On the n-type semiconductor region 1c, a plurality of memory cells having, for example, floating gate electrodes (charge accumulation layers) FG and control gate electrodes CG are formed. The plurality of memory cells are connected in series, and constitute the NAND string.

One end of the NAND string is a source terminal to which a source potential Vs is applied, and the other end thereof is a drain terminal to which a drain potential Vd is applied.

In the depletion-type NAND flash memory, a condition where no charge is accumulated in the floating gate electrode FG, for example, is an erased state. In the erased state, the threshold is a negative potential, so that when the gate potential (potential of the control gate electrode CG) is 0 V, a channel is formed and the memory cells are on.

Furthermore, a condition where a charge is accumulated in the floating gate electrode FG is a written state. In the programmed state, the threshold is a positive potential, so that when the gate potential is 0 V, no channel is formed and the memory cells are off.

In the off-state, a depletion layer D1, for example, extends from the upper end of the n-type semiconductor region 1c (one end on the side of the floating gate electrode FG) to the lower end of the n-type semiconductor region 1c (the other end on the side of the buried insulating layer 1b). Here, a depletion layer D2 is not taken into consideration.

Thus, if the gate potential is gradually increased in the memory cell (selected cell) in a written state, the lower end of depletion layer D1 separates from the buried insulating layer 1b when the gate potential has exceeded the threshold of the selected cell which is decided by the charge quantity in the floating gate electrode FG of the selected cell. Thus, a channel is formed, and the selected cell is turned on.

If there is only one quantity (prescribed value) of a charge accumulated in the floating gate electrode FG, a binary memory is obtained. If there are two or more, a multivalued memory is obtained.

The back bias Vbias is, for example, a potential applied to the p-type semiconductor region 1a in such a depletion-type NAND flash memory. The back bias Vbias, for example, a negative potential, and controls the expansion/contraction of depletion layer D2 generated from the lower end of the n-type semiconductor region 1c toward the upper end thereof.

The formation of depletion layer D2 is equal to the movement of the position of the lower end of the n-type semiconductor region 1c to the upper end of depletion layer D2 (one end on the side of the floating gate electrode FG). When the back bias Vbias is a negative potential, the amount of movement is greater if the absolute value of the back bias Vbias is higher.

Therefore, the threshold of the memory cell is higher if the absolute value of the back bias (negative potential) Vbias is higher. The threshold of the memory cell is lower if the absolute value of the back bias Vbias is lower.

Figure 11:
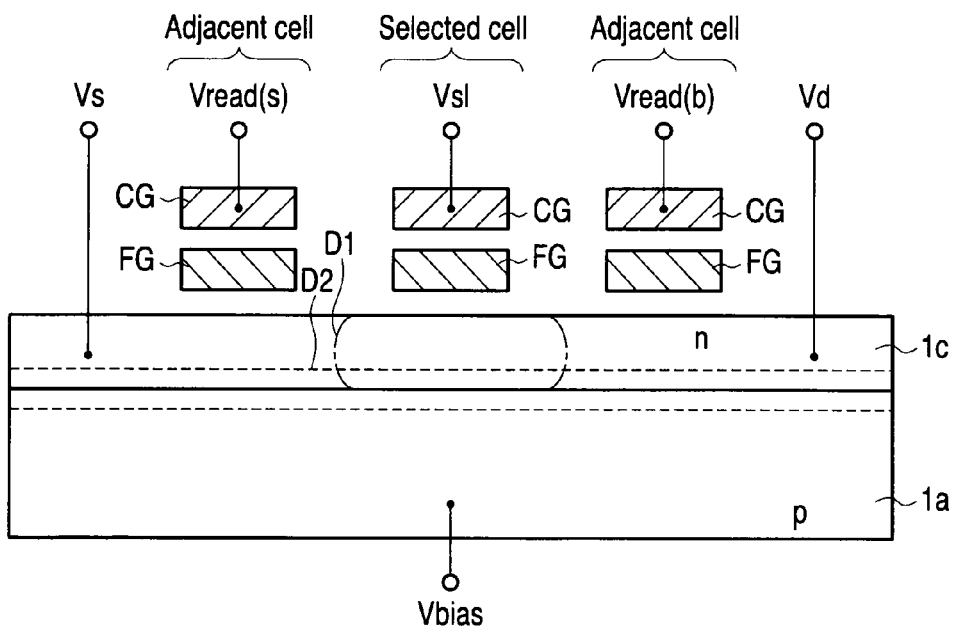
FIG. 11 is a diagram showing the back bias.

In addition, the above-described principle is also applied to a depletion-type NAND flash memory having a structure shown in FIG. 11. The structure in FIG. 11 is different from the structure in FIG. 10 in that there is no buried insulating layer (SOI insulating layer) and in that a p-type semiconductor region 1a and an n-type semiconductor region 1c form a pn junction.

Figure 12:
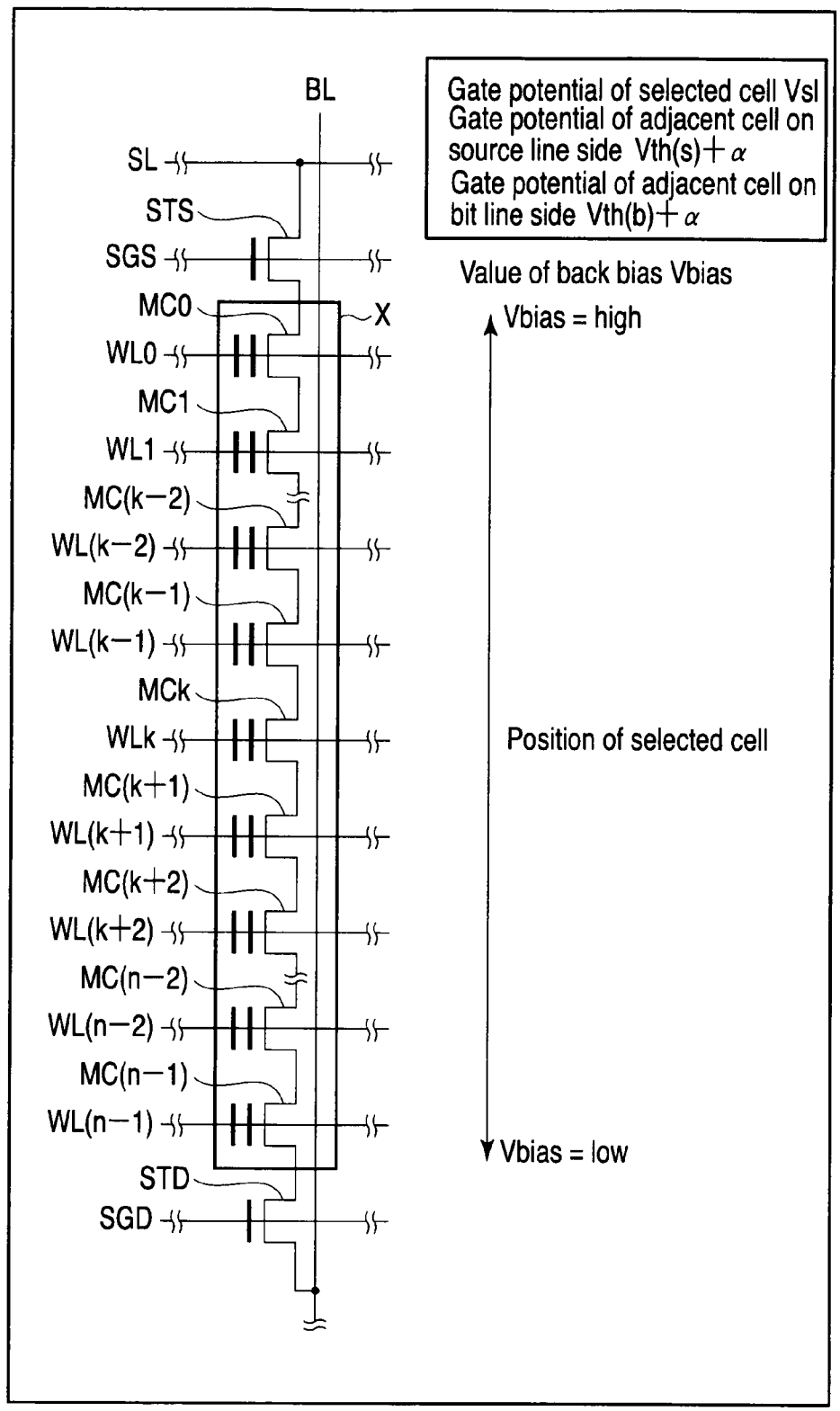
FIG. 12 is a diagram showing a potential relationship in a third embodiment.

FIG. 12 shows a potential relationship in the third embodiment.

It is premised that a NAND string X is constituted of n serially connected memory cells MC0, MC1, MC2, . . . , MCk−2, MCk−1, MCk, MCk+1, MCk+2, . . . , MCn−2, MCn−1, and that each memory cell is configured by a depletion-type n-channel MOSFET.

Furthermore, the selected cell moves one by one from the memory cell MC0 closest to the source line side to the memory cell MC(n−1) closest to the bit line side in the read operation.

The gate potential of the selected cell is set to a potential Vsl at which the selected cell MCk is turned on or off in accordance with a threshold Vth (sel.) of the selected cell.

The gate potentials of all the rest of the unselected cells but the selected cell and two cells adjacent to the selected cell are set at a potential Vread at which the cells are always turned on regardless of the threshold Vth(unsel.) of the unselected cells.

The gate potential of the cell adjacent to the source line SL side of the selected cell is set at Vread(s)=Vth(s)+α obtained by adding a particular potential +α to the threshold Vth(s) of the adjacent cell. The gate potential of the cell adjacent to the bit line BL side of the selected cell is set at Vread(b)=Vth(b)+α obtained by adding the particular potential +α to the threshold Vth(b) of the adjacent cell.

That is, the difference +α=Vread(s)−Vth(s) between the gate potential of the adjacent cell on the source line SL side and the threshold is equal to the difference +α=Vread(s)−Vth(s) between the gate potential of the adjacent cell on the bit line BL side and the threshold.

At this point, the source line SL is set at Vs (e.g., 0.5 V). The bit line BL is set at Vd (e.g., 1.2 V). A select gate line SGS is set at Vsgs (0 V), and a select gate line SGD is set at Vsgd (0 V).

In the meantime, as has been described in the second embodiment, the threshold (associated with the same data) tends to decrease toward the source line in a plurality of memory cells (a plurality of depletion-type FETs) in the NAND string X.

In the third embodiment, in order to eliminate the variation of the threshold, the absolute value of the back bias Vbias is higher when the position of the selected cell is closer to the source line SL, while the back bias Vbias is lower when the position of the selected cell is closer to the bit line BL in the read operation.

Vbias can be changed, for example, in the following ways: (A) Vbias is successively changed every change of the position of the selected cell (successive change); (B) Vbias is changed step by step in response to two or more changes of the position of the selected cell (step-by-step change); (C) Vbias is changed by the combination of A and B.

Furthermore, A, B or C can be applied only to m(<n) memory cells on the source line SL side among n memory cells in the NAND string. In this case, with regard to n-m memory cells on the bit line side, Vbias is fixed regardless of the position of the selected cell.

As described above, the change of Vbias is based on the fact that the threshold of the selected cell is higher when the absolute value of Vbias is higher. That is, the threshold of the selected cell is higher if Vbias is higher, while the threshold of the selected cell is lower if Vbias is lower.

Thus, when a memory cell on the source line side in which at least the threshold tends to be low is the selected cell, Vbias is increased to correct the threshold of the selected cell to a higher value. Thereby, the variation of the threshold of the plurality of memory cells in the NAND string is eliminated.

Table 2 shows an example of Vbias.

TABLE 2

| Selected word line | Vd | Vs | Vread(s)/Vread(b) | Vbias |
|---|---|---|---|---|
| WL01~WL03 | 1.2 V | 0.5 V | Vth(s) + 3.5 V/ | −0.5 V |
| WL04~WL06 | | | Vth(b) + 3.5 V | −0.25 V |
| WL07~WL62 | | | | 0.0 V |

In this example, the number of word lines in one block, that is, the number of word lines in one NAND string is 64. These word lines are represented by WL00 to WL63. WL00 is the word line closest to the source line, and WL63 is the word line closest to the bit line.

Furthermore, the memory cells connected to WL00 and WL63 are dummy cells, and their threshold is fixed at, for example, a negative potential as an erased state (or an initial state).

In this case, the word line connected to the selected cell is one of WL01 to WL62. The word line connected to the selected cell is the selected word line.

The potential (source potential) Vs of the source line SL is, for example, 0.5 V, and the potential (drain potential) Vd of the bit line BL is, for example, 1.2 V.

Moreover, +α is, for example, 3.5V. That is, Vread(s) of the cell adjacent to the source line SL side of the selected cell is set at Vth(s)+α (=3.5 V), and Vread(b) of the cell adjacent to the bit line BL side of the selected cell is set at Vth(b)+α (=3.5 V).

Regardless of the position of the selected cell, +α is fixed.

When one of WL01 to WL03 is selected, Vbias is, for example, −0.5 V. When one of WL04 to WL06 is selected, Vbias is, for example, −0.25 V. When one of WL07 to WL62 is selected, Vbias is, for example, 0 V.

Figure 13B:
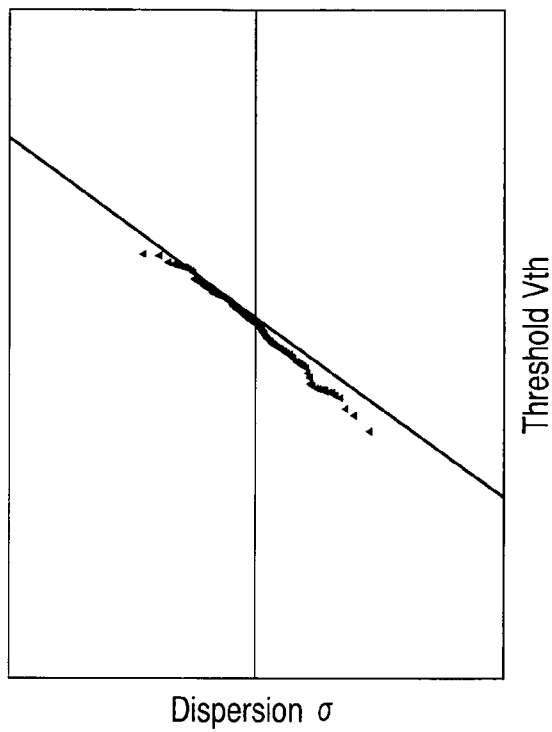
FIGS. 13A and 13B are graphs showing effects of the improvement in threshold variation according to the third embodiment.
Figure 13A:
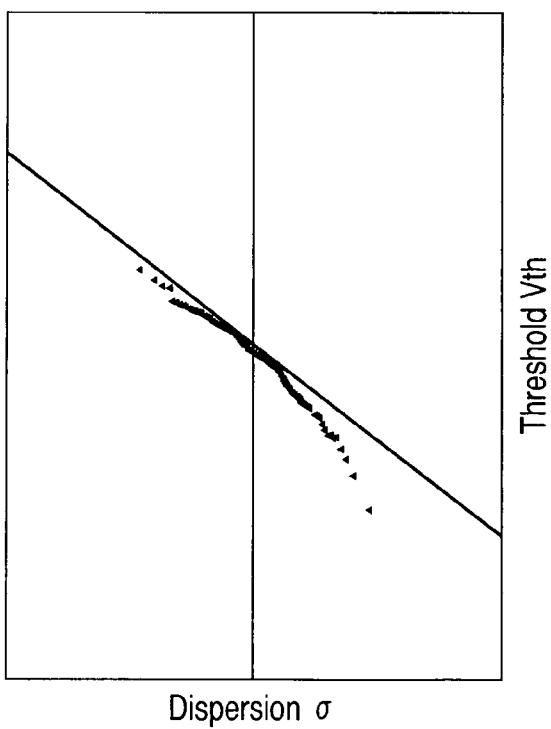

FIGS. 13A and 13B shows effects of the improvement in the threshold variation according to the third embodiment.

FIGS. 13A and 13B shows Weibull plots of threshold voltages in the case where a current in the vicinity of a linear area in the dynamic characteristics of a memory cell is set as a threshold current.

Here, the definition of the points is the same as in that FIGS. 1A and 1B and are not described.

In the case of the Weibull plot shown in FIG. 13A, read operation is performed on the following condition: the gate potential of the cell adjacent to the source line is Vread(s)= Vth(s)+α; the gate potential of the cell adjacent to the bit side is Vread(b)=Vth(b)+α; and the gate potentials of the other unselected cells are Vread. Regardless of the position of the word line, +α is fixed. FIG. 13A corresponds to FIG. 4B.

In the case of the Weibull plot shown in FIG. 13B, read operation is performed on the following condition: the gate potential of the cell adjacent to the source side is Vread(s)= Vth(s)+α; the gate potential of the cell adjacent to the bit side is Vread(b)=Vth(b)+α; the gate potentials of the other unselected cells are Vread; and Vbias is changed depending on the position of the selected cell. Regardless of the position of the word line, +α is fixed.

Vread is 5.5 V and +α is 3.5 V.

In FIG. 13A, Vbias is 0 V. In FIG. 13B, there are three magnitudes of Vbias: −0.5, −0.25 and 0 V, and Vbias is decided in accordance with Table 2.

Moreover, the potential (source potential) Vd of the source line in reading is 0.5 V, and the potential (drain potential) Vd of the bit line is 1.2 V.

It is obvious in FIGS. 13A and 13B that more points are located on the straight line and the threshold distribution is closer to the normal distribution in FIG. 13B than in FIG. 13A. It is also obvious that the inclination of the straight line is steeper and the variation of the threshold is smaller in FIG. 13B than in FIG. 13A.

Figure 14B:
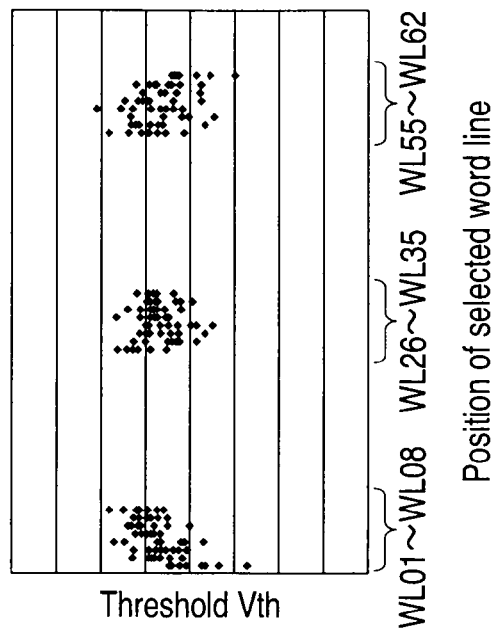
FIGS. 14A and 14B are graphs showing effects of the improvement in the threshold variation according to the third embodiment.
Figure 14A:
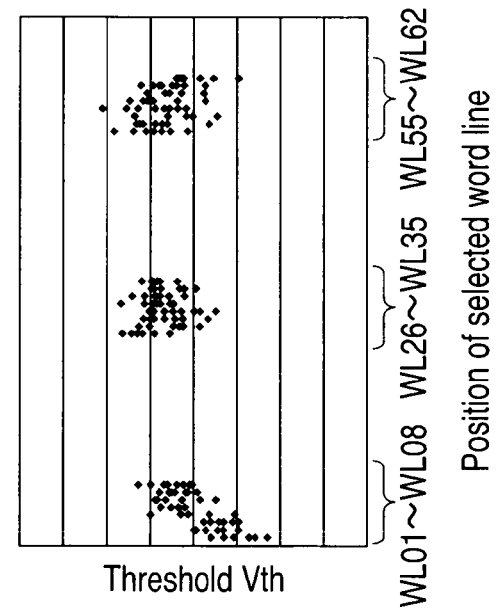

FIGS. 14A and 14B shows the relationship between the position of the selected word line and the threshold. In addition, the word lines WL (e.g., WL09, etc.) that are not shown on the X-axis in FIG. 14 are omitted for convenience.

Samples in FIGS. 14A and 14B are the same as the samples in the Weibull plots shown in FIGS. 13A and 13B. That is, FIGS. 14A and 14B shows how the threshold of each point (corresponding to one memory cell) in FIGS. 13A and 13B changes with the position of the selected word line (the position of the selected cell).

FIG. 14A corresponds to FIG. 13A, and FIG. 14B corresponds to FIG. 13B.

In contrast with FIG. 14A, it is obvious in FIG. 14B, that is, in the third embodiment that the phenomenon of the extremely low threshold of the memory cell on the source line side is prevented and the variation of the threshold distribution is suppressed.

(4) Fourth Embodiment

In the fourth embodiment, for two adjacent cells on both sides of a read target selected cell, the difference +α between a gate potential and a cell threshold is fixed, and a source potential Vs is changed depending on the position of the selected cell, thereby preventing the variation of the threshold of the selected cell. The fourth embodiment corresponds to an embodiment of the third measure in the above-described principle.

The fourth embodiment is an improvement of the first embodiment and therefore includes all the characteristics of the first embodiment. Changing the source potential Vs depending on the position of the selected cell is an additional characteristic of the fourth embodiment that is not in the first embodiment.

Changing the source potential Vs is equivalent to changing the back bias Vbias in the third embodiment. That is, the fourth embodiment is intended to obtain effects similar to the effects in the third embodiment by changing the source potential Vs without changing the back bias Vbias.

Figure 15:
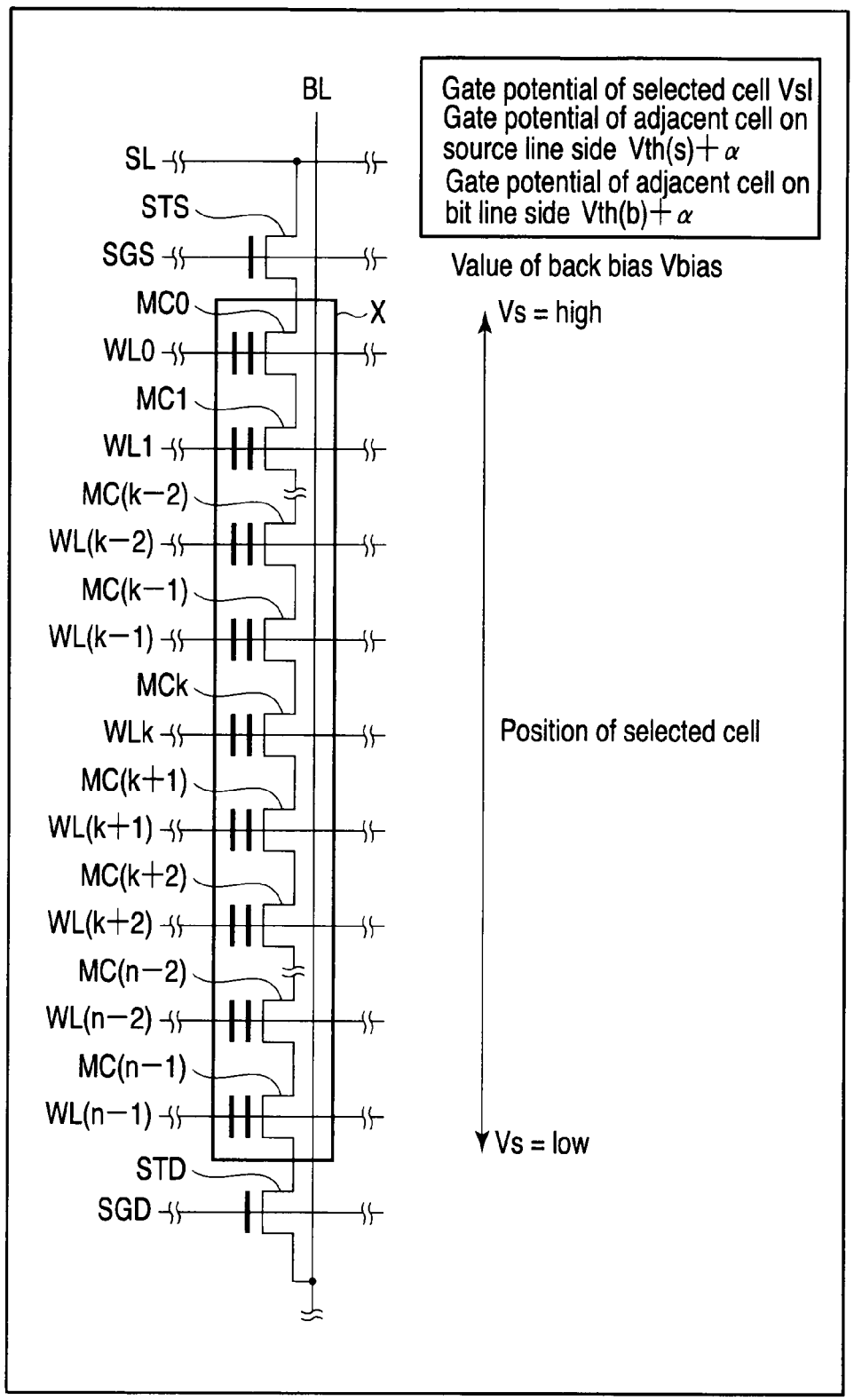
FIG. 15 is a diagram showing a potential relationship in a fourth embodiment.

FIG. 15 shows a potential relationship in the fourth embodiment.

It is premised that a NAND string X is constituted of n serially connected memory cells MC0, MC1, MC2, . . . , MCk−2, MCk−1, MCk, MCk+1, MCk+2, . . . , MCn−2, MCn−1, and that each memory cell is configured by a depletion-type n-channel MOSFET.

The gate potential of the selected cell is set to a potential Vsl at which the memory cell MCk is turned on or off in accordance with a threshold Vth (sel.) of the selected cell.

The gate potentials of all the rest of the unselected cells but the selected cell and two cells adjacent to the selected cell are set at a potential. Vread at which the cells are always turned on regardless of the threshold Vth(unsel.) of the unselected cells.

The gate potential of the cell adjacent to the source line SL side of the selected cell is set at Vread(s)=Vth(s)+α obtained by adding a particular potential +α to the threshold Vth(s) of the adjacent cell. The gate potential of the cell adjacent to the bit line BL side of the selected cell is set at Vread(b)=Vth(b)+α obtained by adding the particular potential +α to the threshold Vth(b) of the adjacent cell.

That is, the difference +α=Vread(s)−Vth(s) between the gate potential of the adjacent cell on the source line SL side and the threshold is equal to the difference +α=Vread(s)−Vth(s) between the gate potential of the adjacent cell on the bit line BL side and the threshold.

At this point, the source line SL is set at Vs. The bit line BL is set at Vd (e.g., 1.2 V). Select gate lines SGS, SGD are set at voltages at which select gate transistors STS, STD are turned on. For example, the select gate line SGS is set at Vsgs (4 V), and the select gate line SGD is set at Vsgd (4 V).

In the meantime, as has been described in the second embodiment, the threshold (associated with the same data) tends to decrease toward the source line in a plurality of memory cells (a plurality of depletion-type FETs) in the NAND string X.

In the fourth embodiment, in order to eliminate the variation of the threshold, the potential of the source line SL, that is, the source potential Vs is higher when the position of selected cell is closer to the source line SL in the read operation, while the source potential Vs is lower when the position of the selected cell is closer to the bit line BL.

Vs can be changed, for example, in the following ways: (A) Vs is successively changed every change of the position of the selected cell (successive change); (B) Vs is changed step by step in response to two or more changes of the position of the selected cell (step-by-step change); (C) Vs is changed by the combination of A and B.

Furthermore, A, B or C can be applied only to m(<n) memory cells on the source line SL side among n memory cells in the NAND string. In this case, with regard to n-m memory cells on the bit line side, Vs is fixed regardless of the position of the selected cell.

The change of Vs is based on the fact that the threshold of the selected cell is substantially higher because a voltage across the gate and the source is lower when Vs is higher. That is, the threshold of the selected cell is higher if Vs is higher, while the threshold of the selected cell is lower if Vs is lower.

Thus, when a memory cell on the source line side in which at least the threshold tends to be low is the selected cell, Vs is increased to correct the threshold of the selected cell to a higher value. Thereby, the variation of the threshold of the plurality of memory cells in the NAND string is eliminated.

Table 3 shows an example of Vs.

TABLE 3

| Selected word line | Vd | Vs | Vread(s)/Vread(b) |
|---|---|---|---|
| WL01~WL03 | 1.2 V | 0.5 V | Vth(s) + 3.5 V/Vth(b) + 3.5 V |
| WL04~WL06 | | 0.25 V | |
| WL07~WL62 | | 0.0 V | |

In this example, the number of word lines in one block, that is, the number of word lines in one NAND string is 64. These word lines are represented by WL00 to WL63. WL00 is the word line closest to the source line, and WL63 is the word line closest to the bit line.

Furthermore, the memory cells connected to WL00 and WL63 are dummy cells, and their threshold is fixed at, for example, a negative potential as an erased state (or an initial state).

In this case, the word line connected to the selected cell is one of WL01 to WL62. The word line connected to the selected cell is the selected word line.

The potential (drain potential) Vd of the bit line BL is, for example, 1.2 V.

Moreover, +α is, for example, 3.5 V. That is, Vread(s) of the cell adjacent to the source line SL side of the selected cell is set at Vth(s)+α (=3.5 V), and Vread(b) of the cell adjacent to the bit line BL side of the selected cell is set at Vth(b)+α (=3.5 V).

Regardless of the position of the selected cell, +α is fixed.

When one of WL01 to WL03 is selected, Vs is, for example, 0.5 V. When one of WL04 to WL06 is selected, Vs is, for example, 0.25 V. When one of WL07 to WL62 is selected, Vs is, for example, 0 V.

Figure 16B:
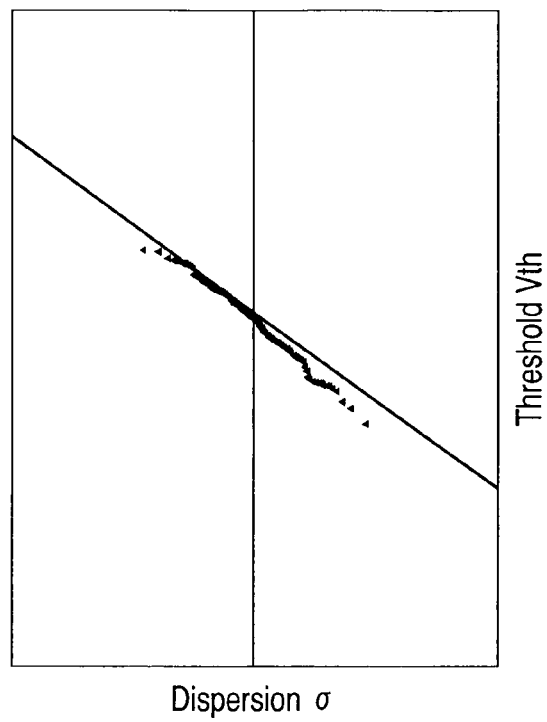
FIGS. 16A and 16B are graph showing effects of the improvement in threshold variation according to the fourth embodiment.
Figure 16A:
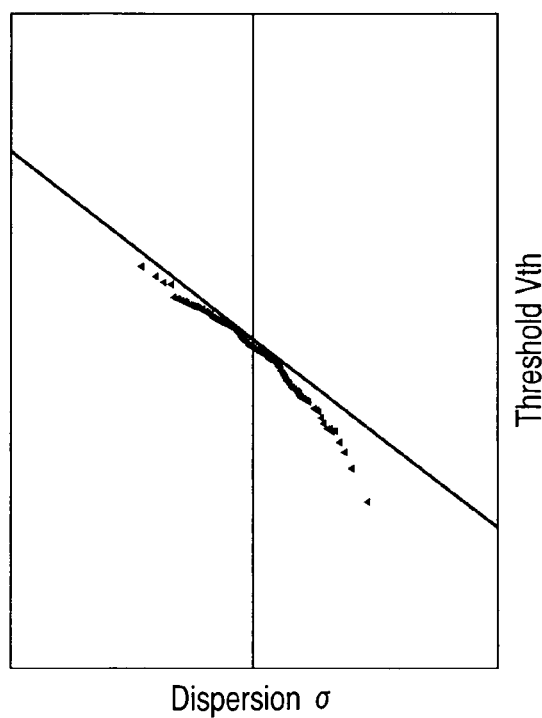

FIGS. 16A and 16B shows effects of the improvement in the threshold variation according to the fourth embodiment.

FIGS. 16A and 16B shows Weibull plots of threshold voltages in the case where a current in the vicinity of a linear area in the dynamic characteristics of a memory cell is set as a threshold current.

Here, the definition of the points is the same as in that FIGS. 1A and 1B and are not described.

In the case of the Weibull plot shown in FIG. 16A, read operation is performed on the following condition: the gate potential of the cell adjacent to the source line is Vread(s)=Vth(s)+α; the gate potential of the cell adjacent to the bit side is Vread(b)=Vth(b)+α; and the gate potentials of the other unselected cells are Vread. Regardless of the position of the word line, +α is fixed. FIG. 16A corresponds to FIG. 4B.

In the case of the Weibull plot shown in FIG. 16B, read operation is performed on the following condition: the gate potential of the cell adjacent to the source side is Vread(s)=Vth(s)+α; the gate potential of the cell adjacent to the bit side is Vread(b)=Vth(b)+α; the gate potentials of the other unselected cells are Vread; and Vs is changed depending on the position of the selected cell. Regardless of the position of the word line, +α is fixed.

Vread is 5.5 V and +α is 3.5 V.

In FIG. 16A, Vs is 0.5 V. In FIG. 16B, there are three magnitudes of Vs: 0.5, 0.25 and 0 V, and Vs is decided in accordance with Table 3.

Moreover, the potential (drain potential) Vd of the bit line in reading is 1.2 V.

It is obvious in FIGS. 16A and 16B that more points are located on the straight line and the threshold distribution is closer to the normal distribution in FIG. 16B than in FIG. 16A. It is also obvious that the inclination of the straight line is steeper and the variation of the threshold is smaller in FIG. 16B than in FIG. 16A.

Figure 17B:
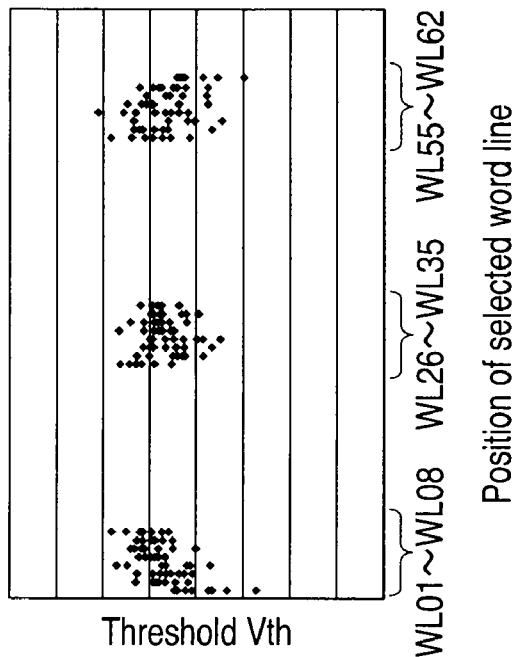
FIGS. 17A and 17B are graph showing effects of the improvement in the threshold variation according to the fourth embodiment.
Figure 17A:
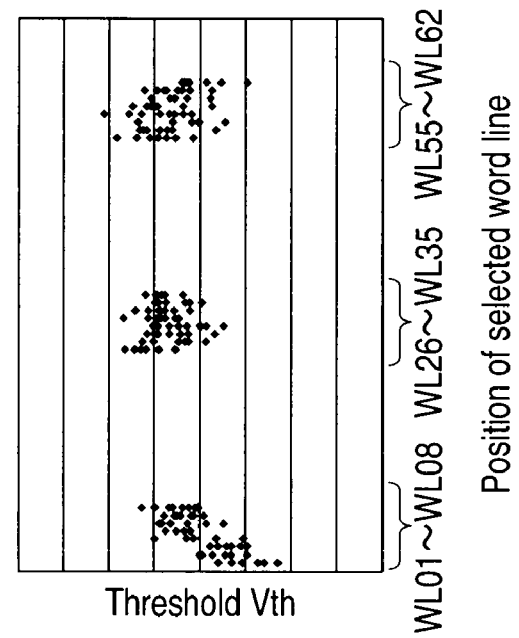

FIGS. 17A and 17B shows the relationship between the position of the selected word line and the threshold. In addition, the word lines WL (e.g., WL09, etc.) that are not shown on the X-axis in FIGS. 17A and 17B are omitted for convenience.

Samples in FIGS. 17A and 17B are the same as the samples in the Weibull plots shown in FIGS. 16A and 16B. That is, FIGS. 17A and 17B shows how the threshold of each point (corresponding to one memory cell) in FIGS. 16A and 16B changes with the position of the selected word line (the position of the selected cell).

FIG. 17A corresponds to FIG. 16A, and FIG. 17B corresponds to FIG. 16B.

The problem of the low threshold of the memory cell on the source line side is not fully solved in FIG. 17A, that is, in the case where the first embodiment is only applied. In contrast, it is obvious in FIG. 17B, that is, in the fourth embodiment that the phenomenon of the extremely low threshold of the memory cell on the source line side is prevented and the variation of the threshold distribution is suppressed.

Similarly to the second embodiment, this embodiment is effective particularly in verify-reading in the selected cell which is in a state before additional writing into the memory cell adjacent to the source line after data has been written into the selected memory cell.

Furthermore, there is no need for a negative potential in contrast with the third embodiment, which enables the size reduction of a semiconductor device. Moreover, it is possible to prevent the phenomenon of the extremely low threshold of the memory cell on the source line side.

3. Application

The present invention relates to a depletion-type NAND flash memory, and in order to obtain such a depletion-type NAND flash memory, there have recently been proposed various memory cell array structures. Here, some of these structures are described.

(1) Block Diagram

First, a block diagram is described.

FIG. 18 shows a depletion-type NAND flash memory.

A memory cell array 1 has a plurality of blocks BK1, BK2, . . . , BKj.

A data latch circuit 2 has a function of temporarily latching data during reading/writing, and is configured by, for example, a flip-flop circuit.

An input/output (I/O) buffer 3 functions as an interface circuit for data. An address buffer 4 functions as an interface circuit for address signals.

The address signals include a block address signal, a row address signal and a column address signal.

A row decoder 5 selects one of the plurality of blocks BK1, BK2, . . . , BKj in accordance with the block address signal, and selects one of a plurality of word lines in the selected block in accordance with the row address signal. A word line driver 7 drives the plurality of word lines in the selected block.

A column decoder 6 selects one of a plurality of bit lines in accordance with the column address signal.

A substrate/source potential control circuit 8 controls the potential of a semiconductor substrate and the potential of a source line. The semiconductor substrate includes a well therein.

The back bias Vbias in the third embodiment and the source potential Vs in the fourth embodiment are generated by the substrate/source potential control circuit 8.

A potential generating circuit 9 generates a potential for controlling the word line driver 7, and potentials supplied to the plurality of word lines in the selected block and two select gate lines.

In the first to fourth embodiments, $+\alpha$, Vsl, Vread, Vread(s) and Vread(b) are generated by the potential generating circuit 9.

A control circuit 10 controls, for example, the operations of the substrate/source potential control circuit 8 and the potential generating circuit 9.

A particular potential storage 10a is a component which stores the particular potential $+\alpha$. The particular potential storage 10a is composed of a plurality of memory cells, and data is stored in these memory cells. When $+\alpha$ is changed in accordance with the position of the selected cell in the second embodiment, a plurality of data are stored in the particular potential storage, and the particular potential is changed by the difference between the data. For example, the particular potential is set at 3.5 V in the case of data "00". The particular potential is set at 3.0 V in the case of data "01". In addition, the particular potential storage may be formed in the memory cell array 1.

An adjacent memory cell threshold storage 10b is a component which stores the threshold of a memory cell adjacent to the selected cell. The adjacent memory cell threshold storage 10b is configured by, for example, a latch circuit.

A transfer potential selector 10c selects a potential to be supplied to each of the plurality of word lines in the selected block in accordance with information on, for example, an operation mode and the position of the selected word line. The transfer potential selector 10c supplies the potential to the plurality of word lines via the word line driver 7.

The control circuit 10 determines the particular potential by the data stored in the particular potential storage, and adds the threshold in the adjacent memory cell threshold storage to the particular potential to generate Vread(b) or Vread(s) in the potential generating circuit 9. Vread(b), Vread(s) is transferred to the gate potential of the cell adjacent to the selected cell by the transfer potential selector 10c.

(2) MONOS Structure+SOI Structure

All of the first to fourth embodiments can be applied to this structure.

Figure 19:
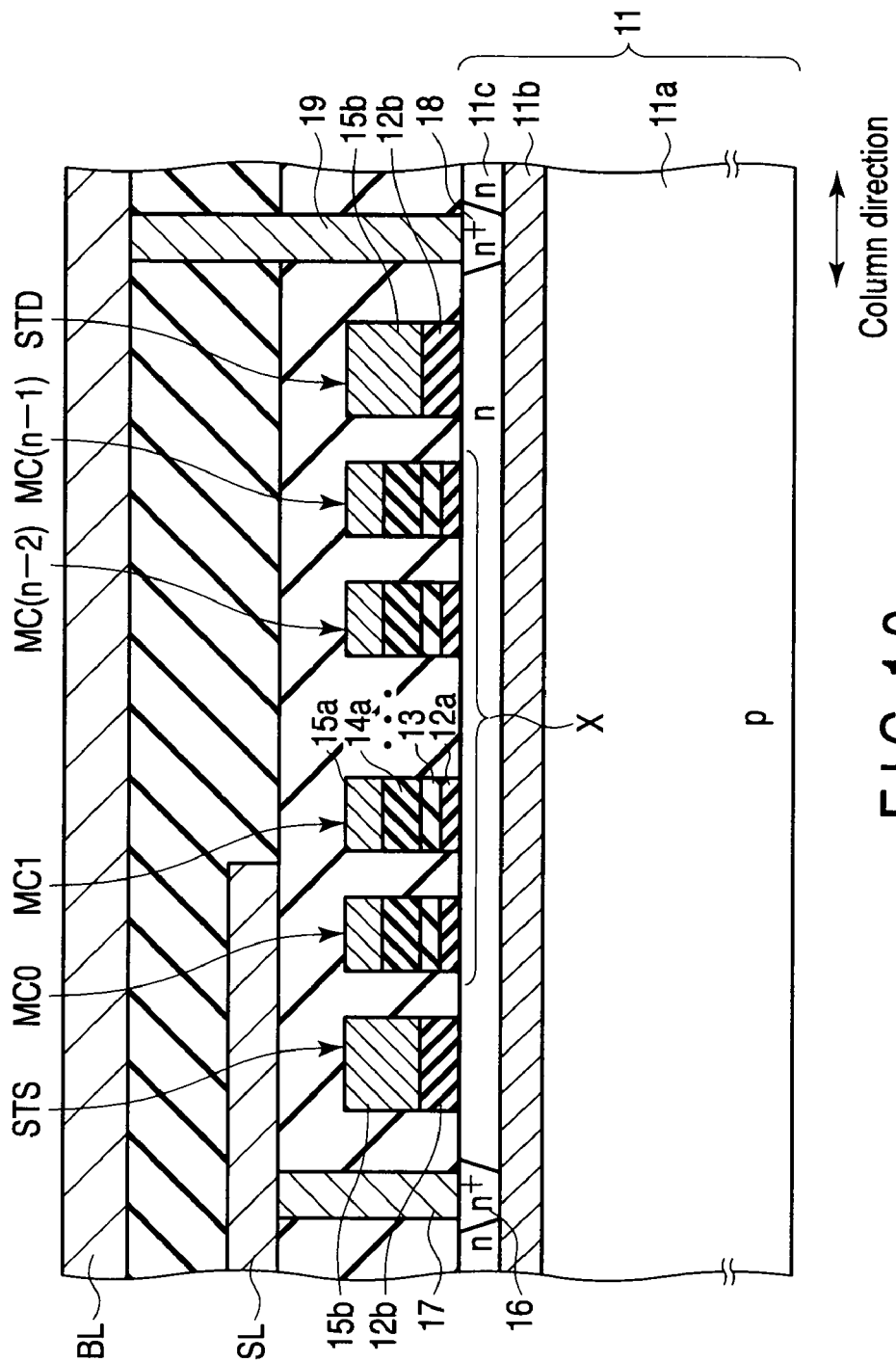
FIG. 19 is a sectional view showing an example of the configuration of a NAND string.

FIG. 19 shows a NAND string.

A MONOS structure is a cell structure in which a charge accumulation layer of a memory cell configured by a depletion-type FET is made of an insulator such as silicon nitride.

A semiconductor substrate 11 has an SOI structure. That is, the semiconductor substrate 11 is composed of a p-type semiconductor region 11a, a buried insulating layer (SOI insulating layer) 11b on the p-type semiconductor region 11a, and an n-type semiconductor region 11c on the buried insulating layer 11b.

Formed on the n-type semiconductor region 11c are a NAND string X composed of n serially connected memory cells MC0, MC1, MC2, . . . , MC(n−2), MC(n−1), and two select gate transistors STS, STD connected to both ends of the NAND string X, respectively.

Each of the memory cells MC1 (i=0 to n−1) has a gate insulating film (e.g., silicon oxide) 12a on the n-type semiconductor region 11c, a charge accumulation layer (e.g., silicon nitride) 13 on the gate insulating film 12a, a block insulating film 14a on the charge accumulation layer 13, and a control gate electrode 15a on the block insulating film 14a.

The block insulating film 14a is an insulating film which blocks a leakage between the charge accumulation layer 13 and the control gate electrode 15a.

Each of the select gate transistors STS, STD has a gate insulating film (e.g., silicon oxide) 12b on the n-type semiconductor region 11c, and a select gate electrode 15b on the gate insulating film 12b.

A source diffusion layer 16 is formed at one end of the NAND string X, and a drain diffusion layer 18 is formed at the other end of the NAND string X.

The source diffusion layer 16 is connected to a source line SL via a contact plug 17. The drain diffusion layer 18 is connected to a bit line BL via a contact plug 19.

In addition, the channels of the select gate transistors STS, STD can be p-type to form a depletion type.

(3) MONOS Structure+pn Junction Structure

All of the first to fourth embodiments can be applied to this structure.

Figure 20:
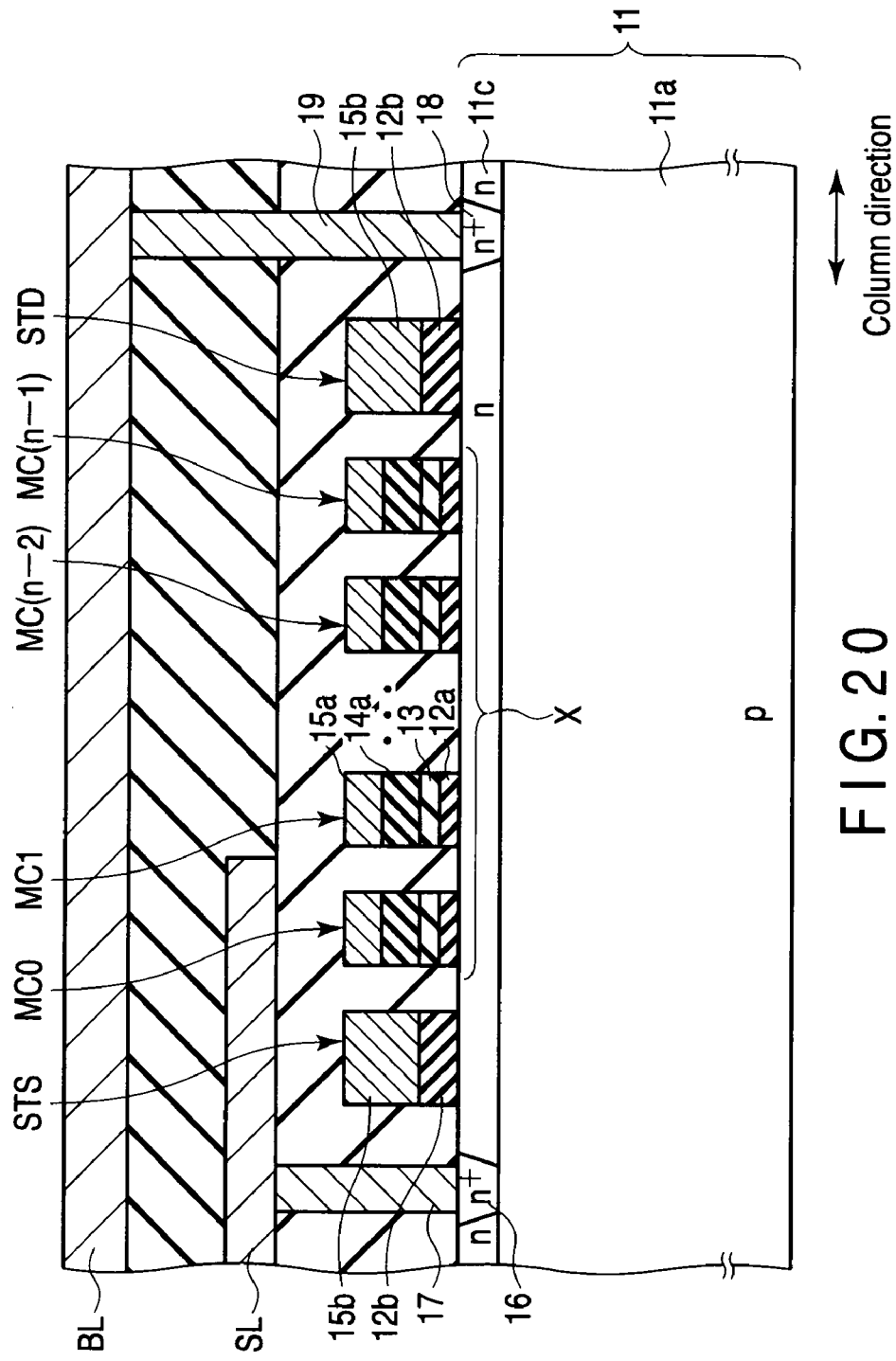
FIG. 20 is a sectional view showing an example of the configuration of a NAND string.

FIG. 20 shows a NAND string.

A semiconductor substrate 11 is composed of a p-type semiconductor region 11a, and an n-type semiconductor region 11c on the p-type semiconductor region 11a. The p-type semiconductor region 11a and the n-type semiconductor region 11c form a pn junction.

Formed on the n-type semiconductor region 11c are a NAND string X composed of n serially connected memory cells MC0, MC1, . . . , MC(n−2), MC(n−1), and two select gate transistors STS, STD connected to both ends of the NAND string X, respectively.

The memory cells MC1 (i=0 to n−1) have a MONOS structure.

Each of the memory cells MC1 has a gate insulating film (e.g., silicon oxide) 12a on the n-type semiconductor region 11c, a charge accumulation layer (e.g., silicon nitride) 13 on the gate insulating film 12a, a block insulating film 14a on the charge accumulation layer 13, and a control gate electrode 15a on the block insulating film 14a.

Each of the select gate transistors STS, STD has a gate insulating film (e.g., silicon oxide) 12b on the n-type semiconductor region 11c, and a select gate electrode 15b on the gate insulating film 12b.

A source diffusion layer 16 is formed at one end of the NAND string X, and a drain diffusion layer 18 is formed at the other end of the NAND string X.

The source diffusion layer 16 is connected to a source line SL via a contact plug 17. The drain diffusion layer 18 is connected to a bit line BL via a contact plug 19.

In addition, the channels of the select gate transistors STS, STD can be p-type to form a depletion type.

(4) Floating Gate Structure+SOI Structure

All of the first to fourth embodiments can be applied to this structure.

Figure 21:
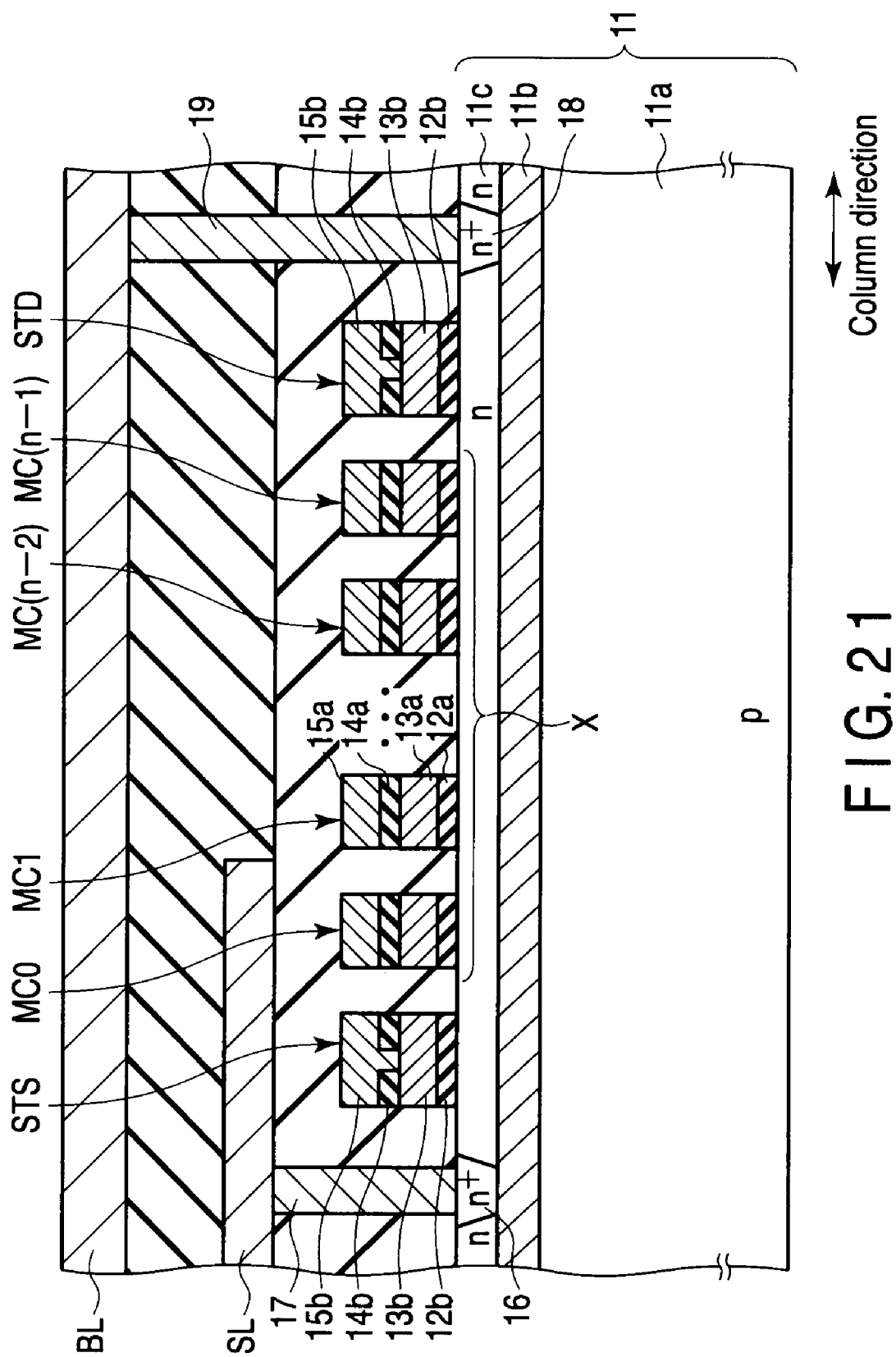
FIG. 21 is a sectional view showing an example of the configuration of a NAND string.

FIG. 21 shows a NAND string.

A floating gate structure is a cell structure in which a charge accumulation layer of a memory cell configured by a depletion-type FET is made of a floating conductor such as conductive polysilicon.

A semiconductor substrate 11 has an SOI structure. That is, the semiconductor substrate 11 is composed of a p-type semiconductor region 11a, a buried insulating layer (SOI insulating layer) 11b on the p-type semiconductor region 11a, and an n-type semiconductor region 11c on the buried insulating layer 11b.

Formed on the n-type semiconductor region 11c are a NAND string X composed of n serially connected memory cells MC0, MC1, . . . , MC(n−2), MC(n−1), and two select gate transistors STS, STD connected to both ends of the NAND string X, respectively.

Each of the memory cells MC1 (i=0 to n−1) has a gate insulating film (e.g., silicon oxide) 12a on the n-type semiconductor region 11c, a charge accumulation layer (e.g., conductive polysilicon) 13a on the gate insulating film 12a, an interelectrode insulating film 14a on the charge accumulation layer 13a, and a control gate electrode 15a on the interelectrode insulating film 14a.

Each of the select gate transistors STS, STD has a gate insulating film (e.g., silicon oxide) 12b on the n-type semiconductor region 11c, a lower gate electrode 13b on the gate insulating film 12b, an interelectrode insulating film 14b on the lower gate electrode 13b, and an upper gate electrode (select gate electrode) 15b on the interelectrode insulating film 14b.

The lower gate electrode 13b and the upper gate electrode 15b are electrically connected to each other via an opening provided in the interelectrode insulating film 14b.

A source diffusion layer 16 is formed at one end of the NAND string X, and a drain diffusion layer 18 is formed at the other end of the NAND string X.

The source diffusion layer 16 is connected to a source line SL via a contact plug 17. The drain diffusion layer 18 is connected to a bit line BL via a contact plug 19.

In addition, the channels of the select gate transistors STS, STD can be p-type to form a depletion type.

(5) Floating Gate Structure+pn Junction Structure

All of the first to fourth embodiments can be applied to this structure.

Figure 22:
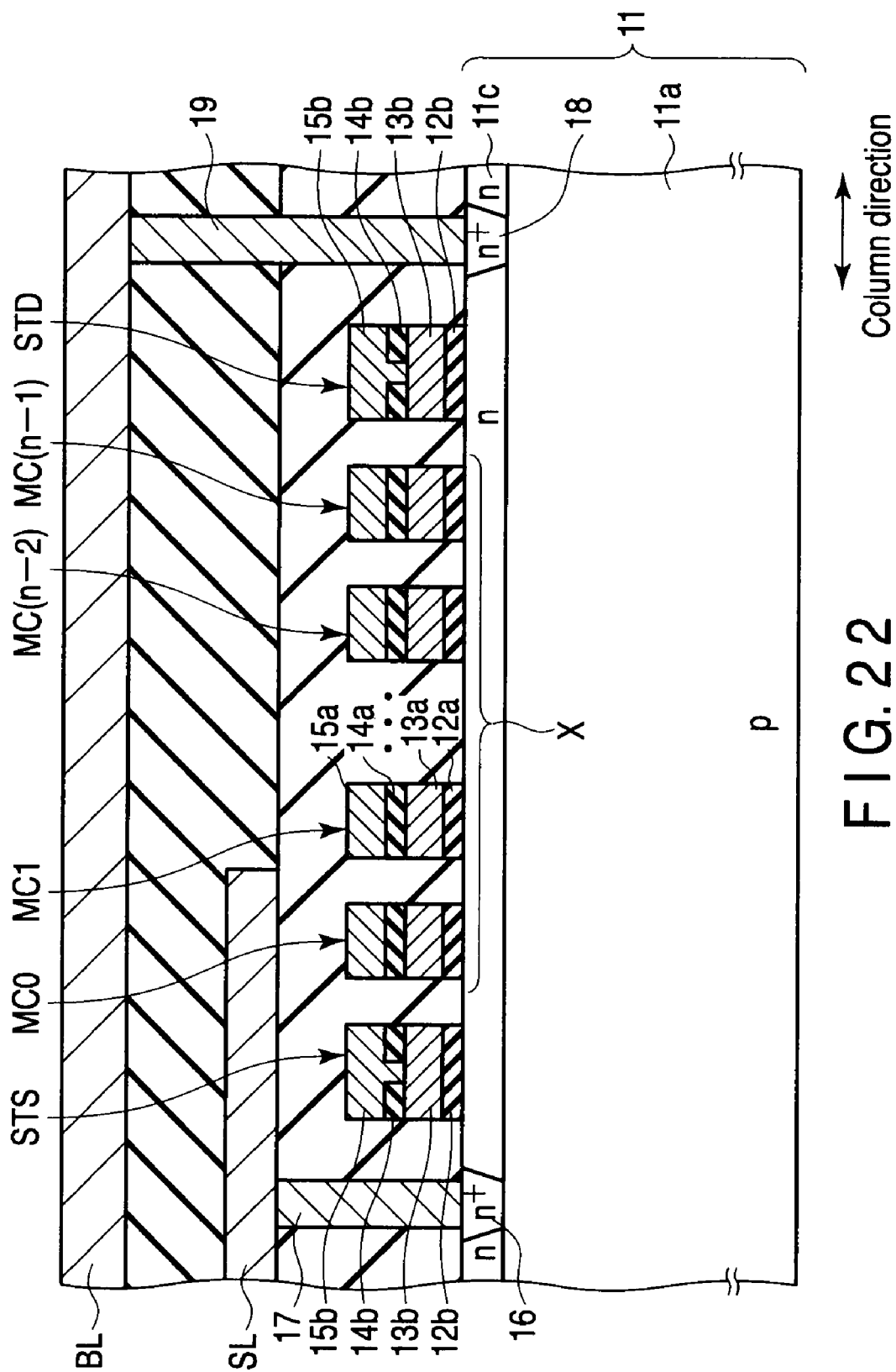
FIG. 22 is a sectional view showing an example of the configuration of a NAND string.

FIG. 22 shows a NAND string.

A semiconductor substrate 11 is composed of a p-type semiconductor region 11a, and an n-type semiconductor region 11c on the p-type semiconductor region 11a. The p-type semiconductor region 11a and the n-type semiconductor region 11c form a pn junction.

Formed on the n-type semiconductor region 11c are a NAND string X composed of n serially connected memory cells MC0, MC1, . . . , MC(n−2), MC(n−1), and two select gate transistors STS, STD connected to both ends of the NAND string X, respectively.

The memory cells MC1 (i=0 to n−1) have a floating gate structure.

Each of the memory cells MC1 has a gate insulating film (e.g., silicon oxide) 12a on the n-type semiconductor region 11c, a charge accumulation layer (e.g., conductive polysilicon) 13a on the gate insulating film 12a, an interelectrode insulating film 14a on the charge accumulation layer 13a, and a control gate electrode 15a on the interelectrode insulating film 14a.

Each of the select gate transistors STS, STD has a gate insulating film (e.g., silicon oxide) 12b on the n-type semiconductor region 11c, a lower gate electrode 13b on the gate insulating film 12b, an interelectrode insulating film 14b on the lower gate electrode 13b, and an upper gate electrode (select gate electrode) 15b on the interelectrode insulating film 14b.

The lower gate electrode 13b and the upper gate electrode 15b are electrically connected to each other via an opening provided in the interelectrode insulating film 14b.

A source diffusion layer 16 is formed at one end of the NAND string X, and a drain diffusion layer 18 is formed at the other end of the NAND string X.

The source diffusion layer 16 is connected to a source line SL via a contact plug 17. The drain diffusion layer 18 is connected to a bit line BL via a contact plug 19.

In addition, the channels of the select gate transistors STS, STD can be p-type to form a depletion type.

(6) Three-Dimensional Structure

The first, second and fourth embodiments can be applied to this structure.

FIG. 23 shows a first example of a three-dimensional structure.

A source line side select gate transistor STS is formed in the surface region of a p-type semiconductor substrate 21. The select gate transistor STS is composed of, n-type diffusion layers 22a, 22b, a gate insulating film 23 on a channel between the n-type diffusion layers 22a, 22b, and a select gate electrode 24 on the gate insulating film 23.

The n-type diffusion layer 22a is connected to a source line SL.

A columnar active layer 25 extending in a Z-direction is formed on the n-type diffusion layer 22b. The columnar active layer 25 serves as an n-type semiconductor region. A drain diffusion layer 26 is formed at the upper end of the active layer 25. The drain diffusion layer 26 is connected to a bit line BL via a bit line contact BC.

Formed on the side surface of the active layer 25 are a NAND string X composed of n serially connected memory cells MC0, . . . , MC(n−1), and a bit line side select gate transistor STD connected to one end of the drain side (bit line side) of the NAND string X.

Each of the memory cells MC1 (i=0 to n−1) has a gate insulating film (e.g., silicon oxide) 27 on the side surface of the active layer 25, a charge accumulation layer (e.g., silicon nitride) 28 on the gate insulating film 27, a block insulating film 29 on the charge accumulation layer 28, and control gate electrodes CG0, . . . , CG(n−1) on the block insulating film 29.

The select gate transistor STD has a gate insulating film (e.g., silicon oxide) 27 on the side surface of the active layer 25, and a select gate electrode 28 on the gate insulating film 27.

Figure 24:
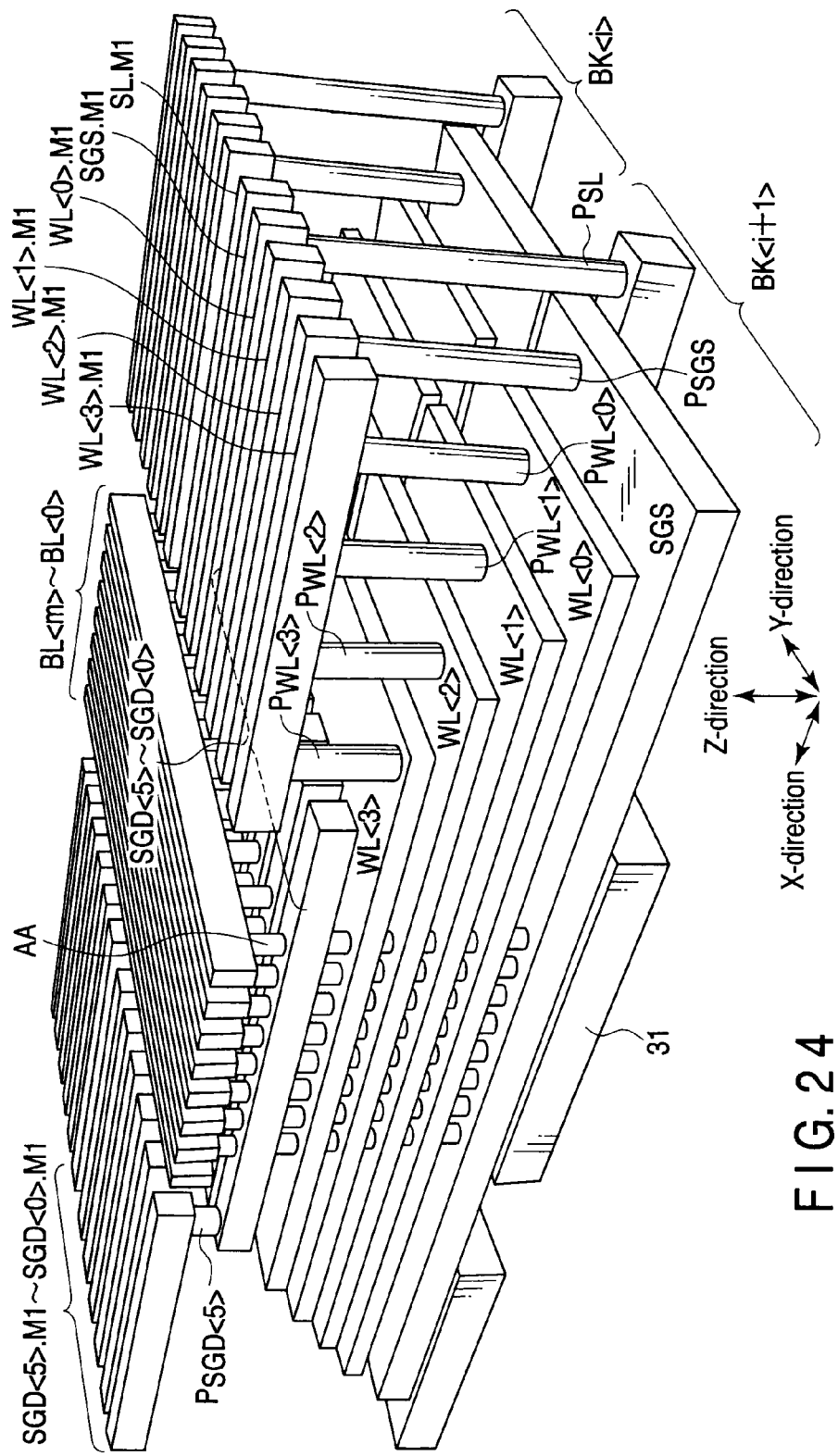
FIG. 24 is a perspective view showing a second example of the three-dimensional structure.

FIG. 24 shows a second example of a three-dimensional structure.

This structure is called a bit cost scalable (BiCS) structure.

A memory cell array is composed of a plurality of blocks, and each block serves as one unit of erasure, for example. Here, two blocks BK<i>, BK<i+1> are shown.

For example, one common source diffusion layer 31 formed in a semiconductor substrate is provided for all the blocks. The source diffusion layer 31 is connected to a source line SL●M1 via a contact plug $P_{SL}$. Further, three or more conducting layers made of, for example, conductive polysilicon are stacked on the source diffusion layer 31 (a six-layer structure in this example).

Five conducting layers except for the uppermost layer are formed like plates in one block BK<i+1>, and the ends of these layers in the X-direction are formed like steps to allow contact with each of the conducting layers. The lowermost layer serves as a source line side select gate line SGS. Four conducting layers except for the lowermost and uppermost layers serve as word lines WL<0>, WL<1>, WL<2>, WL<3>.

The uppermost layer is composed of a plurality of linear conducting wires extending in the X-direction. For example, six conducting wires are arranged in one block BK<i+1>. For example, the six conducting wires in the uppermost layer serve as bit line side select gate lines SGD<0>, ..., SGD<5>.

Furthermore, a plurality of active layers (active areas) AA for constituting a NAND cell unit are formed like columns in the Z-direction (a direction perpendicular to the surface of the semiconductor substrate) to reach the source diffusion layer 31 through the plurality of conducting layers.

The upper ends of the plurality of active layers AA are connected to a plurality of bit lines BL<0>, ..., BL<m> extending in the Y-direction. Further, the source line side select gate line SGS is connected, via a contact plug $P_{SGS}$, to a leader line SGS●M1 extending in the X-direction. The word lines WL<0>, WL<1>, WL<2>, WL<3> are connected, via contact plugs $P_{WL<0>}$, $P_{WL<1>}$, $P_{WL<2>}$, $P_{WL<3>}$, to leader lines WL<0>●M1, WL<1>●M1, WL<2>●M1, WL<3>●M1 extending in the X-direction, respectively.

Furthermore, the bit line side select gate lines SGD<0>, ..., SGD<5> are connected, via contact plugs $P_{SGD<0>}$, ..., $P_{SGD<5>}$, to leader lines SGD<0>●M1, ..., SGD<5>●M1 extending in the X-direction, respectively.

The plurality of bit lines BL<0>, ..., BL<m> and the leader lines SGS●M1, WL<0>●M1, WL<1>●M1, WL<2>●M1, WL<3>●M1, SGD<0>●M1, ..., SGD<5>●M1 are made of, for example, metal.

FIGS. 25A, 25B and 25C shows the NAND string in FIG. 24 in detail.

The memory cell MC has, for example, a MONOS structure.

A select gate transistor ST has, for example, the same structure as the memory cell MC.

However, a gate insulating film of the select gate transistor ST may have a structure different from that of the memory cell MC, that is, a structure having no charge accumulation layer.

One of the characteristics of the NAND string of the three-dimensional structure is that the source line side select gate line SGS, the word lines WL<0>, WL<1>, WL<2>, WL<3> and the bit line side select gate lines SGD<0>, ..., SGD<5> have a structure that encloses the side surfaces of the columnar active layers AA.

Thus, even if, for example, the plurality of active layers AA are thinned to form more active layers AA on the semiconductor substrate for the increase of capacity, sufficient driving force of transistors constituting the NAND cell unit can be ensured.

4. Conclusion

According to the present invention, the threshold variation of a memory cell in reading can be prevented in a depletion-type NAND flash memory.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A depletion-type NAND flash memory comprising: a NAND string composed of a plurality of serially connected depletion-type FETs; a control circuit which controls gate potentials of the plurality of depletion-type FETs in a read operation; a particular potential storage; and an adjacent memory cell threshold storage, wherein each of the plurality of depletion-type FETs is a transistor whose threshold changes in accordance with a charge quantity in a charge accumulation layer; the adjacent memory cell threshold storage stores a threshold of a source line side depletion-type FET adjacent to a source line side of a selected depletion-type FET; and the control circuit applies a potential to the gate electrode of the source line side depletion-type FET in the read operation, the applied potential being obtained by adding a particular potential stored in the particular potential storage to a threshold stored in the adjacent memory cell threshold storage.

2. The NAND flash memory according to claim 1, wherein the particular potential increases as a position of the selected depletion-type FET becomes closer to a bit line side.

3. The NAND flash memory according to claim 1, wherein the plurality of depletion-type FETs are arranged at one end side of a first semiconductor region of a first conductivity type, and the expansion of a depletion layer at the other end side of the first semiconductor region is controlled by the back bias.

4. The NAND flash memory according to claim 3, wherein a second semiconductor region of a second conductivity type is formed at the other end of the first semiconductor region.

5. The NAND flash memory according to claim 4, wherein the back bias is applied to the second semiconductor region, and the depletion layer is generated between the first and second semiconductor regions.

6. The NAND flash memory according to claim 4, wherein the absolute value of the back bias decreases as a position of the selected depletion-type FET becomes closer to a bit line side.

7. The NAND flash memory according to claim 4, wherein a buried insulating layer is formed between the first semiconductor region and the second semiconductor region.

8. The NAND flash memory according to claim 4, wherein the first conductivity type is a p-type, and the second conductivity type is an n-type.

9. The NAND flash memory according to claim 1, wherein a potential of the source line decreases as a position of the selected depletion-type FET becomes closer to a bit line side.

10. The NAND flash memory according to claim 1, wherein the depletion-type FETs other than the selected depletion-type FET and the adjacent source line side depletion-type FET are set at a constant potential.

11. The NAND flash memory according to claim 1, wherein the depletion-type FET closest to the source line is used as a dummy FET.

12. The NAND flash memory according to claim 1, wherein an optimum value of the particular potential is 1.75 to 4 V.

13. The NAND flash memory according to claim 1, wherein the adjacent memory cell threshold storage stores a threshold of a bit line side depletion-type FET adjacent to a bit line side of the selected depletion-type FET, and the control circuit applies a potential to the gate electrode of the bit line side depletion-type FET in the read operation, the applied potential being obtained by adding a particular potential stored in the particular potential storage to a threshold stored in the adjacent memory cell threshold storage.

14. The NAND flash memory according to claim 13, wherein the particular potential increases as a position of the selected depletion-type FET becomes closer to the bit line side.

15. The NAND flash memory according to claim 13, wherein the potential of the source line decreases as a position of the selected depletion-type FET becomes closer to the bit line side.

16. The NAND flash memory according to claim 13, wherein the plurality of depletion-type FETs are arranged at one end side of a first semiconductor region of a first conductivity type, and the expansion of a depletion layer at the other end side of the first semiconductor region is controlled by the back bias.

17. The NAND flash memory according to claim 16, wherein the absolute value of the back bias decreases as the position of the selected depletion-type FET becomes closer to the bit line side.

18. The NAND flash memory according to claim 13, wherein the selected depletion-type FET and the depletion-type FETs other than the adjacent bit line side depletion-type FET are set at a constant potential.

19. The NAND flash memory according to claim 13, wherein the depletion-type FET closest to the source line is used as a dummy FET, and the depletion-type FET closest to the bit line is used as a dummy FET.

* * * * *